United States Patent
Nakagawa et al.

(10) Patent No.: US 8,270,525 B2
(45) Date of Patent: Sep. 18, 2012

(54) DIGITAL RADIO COMMUNICATIONS METHOD USING MULTI-LEVEL MODULATION SCHEME AND TRANSMITTER AND RECEIVER

(75) Inventors: Takao Nakagawa, Kawasaki (JP); Tetsuya Yano, Kawasaki (JP); Kazuhisa Obuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 678 days.

(21) Appl. No.: 12/145,834

(22) Filed: Jun. 25, 2008

(65) Prior Publication Data
US 2009/0161786 A1    Jun. 25, 2009

Related U.S. Application Data

(63) Continuation of application No. PCT/JP2005/023956, filed on Dec. 27, 2005.

(51) Int. Cl.
*H04L 25/34* (2006.01)

(52) U.S. Cl. ........ 375/286; 375/261; 375/264; 375/295; 375/316

(58) Field of Classification Search .................... 375/286
See application file for complete search history.

(56) References Cited

U.S. PATENT DOCUMENTS

| | | | |
|---|---|---|---|
| 7,093,178 B2 | 8/2006 | Kim et al. | |
| 7,227,908 B2 | 6/2007 | Suzuki et al. | |
| 7,369,621 B2 | 5/2008 | Yoshi et al. | |
| 2002/0080285 A1* | 6/2002 | Oshima | 348/724 |
| 2003/0031233 A1* | 2/2003 | Kim et al. | 375/146 |
| 2005/0108610 A1* | 5/2005 | Kim et al. | 714/748 |

FOREIGN PATENT DOCUMENTS

| | | |
|---|---|---|
| EP | 1408638 | 4/2004 |
| EP | 1411695 | 4/2004 |
| EP | 1564954 | 8/2005 |
| JP | HEI8-79325 | 3/1996 |
| JP | 2002-171298 | 6/2002 |
| JP | 2003-78419 | 3/2003 |
| JP | 2003-143041 | 5/2003 |
| JP | 2004-40661 | 2/2004 |
| JP | 2004-201131 | 7/2004 |
| WO | 03034640 | 4/2003 |
| WO | 03069784 | 8/2003 |

OTHER PUBLICATIONS

"Optimum Signal Set Design of 16 ARY Amplitude Phase Shift Keying", S. Oshita, et al., vol. J72-B-I, No. 8, pp. 675-679, Aug. 1989 (Translation of Paragraph 2).

(Continued)

*Primary Examiner* — Shuwang Liu
*Assistant Examiner* — Lihong Yu
(74) *Attorney, Agent, or Firm* — Myers Wolin, LLC

(57) ABSTRACT

A transmitter for use in digital radio communications systems includes: a bit corrector controls bit arrangement in such a manner that a code having high significance, out of multiple codes obtained by coding, is allocated with high priority to a bit having a tendency that the likelihood enlarges at the time of symbol decision on a receiver; a multi-level modulator allocates the code to the multiple bits in accordance with a predetermined symbol arrangement; and a symbol arrangement controller controls the symbol arrangement from equal distance arrangement to another arrangement in accordance with a ratio of the codes different in significance. To control symbol arrangement increases the effect of bit correction and improves an error rate on the receiver.

13 Claims, 44 Drawing Sheets

OTHER PUBLICATIONS

"Circular-Signal-Set Constellation for 16 APSK and its Performance", M. Machida, et al., vol. J80-B-II No. 10, pp. 815-822, Oct. 1997 (Translation of Paragraphs 3.1 and 3.2).

"Performance Analysis of Various 16 Level Modulation Schemes Under Rayleigh Fading", F. Adachi, et al., Electronic Letters vol. 28 No. 17, Aug. 13, 1992.

"Multiplt-Symbol Differential Detection for Differential Eoncoded Aplitude Modulating Signals and its Application to 16DAPSK", T. Suzuki, et al., vol. J77-BII No. 12, pp. 739-748, Dec. 1994 (Translation of Paragraph 2).

3GPP TS 25.212 V5.2.0, Sep. 2002 (Especially relevant to Section 4.2.3.2, 4.2.7.3 and 4.2.7.4).

International Search Report, Japanese Patent Office, International application No. PCT/JP2005/023956, Jun. 27, 2006.

Samsung: "Text proposal for SMP (Symbol Mapping based on bit Priority)", Agenda Item HSDPA; TSG-RAN WG1 #23; Tdoc R1-02-0024; Espoo, Finland; Jan. 8-11, 2002.

Siemans: "An optimisation of the bit distribution function for HSDPA"; Agenda Item AH32 (HSDPA); TSG-RAN Working Group 1 #24; Tdoc R1-02-0443; Orlando, Florida; Feb. 18-22, 2002.

Extended European search report with the European search opinion issued for corresponding European Patent Application No. 05822726.5 dated Mar. 4, 2012.

* cited by examiner

FIG. 1

| | | | | | | | | | |
|---|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-1 | P1-1 | P2-2 | P1-2 | P2-3 | P1-3 |
| THIRD BIT | P2-4 | P1-4 | P2-5 | P1-5 | P2-6 | P1-6 | P2-7 | P1-7 | P2-8 |
| FOURTH BIT | P1-8 | P2-9 | P1-9 | P2-10 | P1-10 | P2-11 | P1-11 | P2-12 | P1-12 |

SYMBOL →

FIG. 3

| | SYMBOL → | | | | | | | | |
|---|---|---|---|---|---|---|---|---|---|
| FIRST BIT | S1 | S2 | S3 | S4 | P2-1 | P1-1 | P2-2 | P1-2 | P2-3 |
| SECOND BIT | P1-3 | P2-4 | P1-4 | P2-5 | P1-5 | P2-6 | P1-6 | P2-7 | P1-7 |
| THIRD BIT | P2-8 | P1-8 | P2-9 | P1-9 | P2-10 | P1-10 | P2-11 | P1-11 | P2-12 |
| FOURTH BIT | P1-12 | P2-13 | P1-13 | P2-14 | P1-14 | P2-15 | P1-15 | P2-16 | P1-16 |

FIG. 4

| | SYMBOL → | | | | | | | | |
|---|---|---|---|---|---|---|---|---|---|
| FIRST BIT | S1 | S2 | P2-4 | P2-6 | P2-8 | P2-10 | P2-12 | P2-14 | P2-16 |
| SECOND BIT | P2-1 | P1-2 | P1-4 | P1-6 | P1-8 | P1-10 | P1-12 | P1-14 | P1-16 |
| THIRD BIT | P1-1 | P2-3 | P2-5 | P2-7 | P2-9 | P2-11 | P2-13 | P2-15 | P2-17 |
| FOURTH BIT | P2-2 | P1-3 | P1-5 | P1-7 | P1-9 | P1-11 | P1-13 | P1-15 | P1-17 |

FIG. 5

| FIRST BIT | S1 | S2 | P2-1 | P1-1 | P2-2 | P1-2 | P2-3 | P1-3 | P2-4 |
|---|---|---|---|---|---|---|---|---|---|
| SECOND BIT | P1-4 | P2-5 | P1-5 | P2-6 | P1-6 | P2-7 | P1-7 | P2-8 | P1-8 |
| THIRD BIT | P2-9 | P1-9 | P2-10 | P1-10 | P2-11 | P1-11 | P2-12 | P1-12 | P2-13 |
| FOURTH BIT | P1-13 | P2-14 | P1-14 | P2-15 | P1-15 | P2-16 | P1-16 | P2-17 | P1-17 |

SYMBOL →

FIG. 9

| | | | | | | | | | |
|---|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-4 | P1-5 | P2-7 | P1-8 | P2-10 | P1-11 |
| THIRD BIT | P2-1 | P2-2 | P2-3 | P1-4 | P2-6 | P1-7 | P2-9 | P1-10 | P2-12 |
| FOURTH BIT | P1-1 | P1-2 | P1-3 | P2-5 | P1-6 | P2-8 | P1-9 | P2-11 | P1-12 |

SYMBOL →

FIG. 13

SYMBOL →

| | | | | | | | | |
|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-4 | P1-5 | P2-7 | P1-8 | P2-10 | P1-11 |
| THIRD BIT | P2-1 | P2-2 | P2-3 | P1-4 | P2-6 | P1-7 | P2-9 | P1-10 | P2-12 |
| FOURTH BIT | P1-1 | P1-2 | P1-3 | P2-5 | P1-6 | P2-8 | P1-9 | P2-11 | P1-12 |

FIG. 14

SYMBOL →

| | | | | | | | | |
|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-1 | P1-1 | P2-2 | P1-2 | P2-3 | P1-3 |
| THIRD BIT | P2-4 | P1-4 | P2-5 | P1-5 | P2-6 | P1-6 | P2-7 | P1-7 | P2-8 |
| FOURTH BIT | P1-8 | P2-9 | P1-9 | P2-10 | P1-10 | P2-11 | P1-11 | P2-12 | P1-12 |

FIG. 17

| | SYMBOL → | | | | | | | |
|---|---|---|---|---|---|---|---|---|
| FIRST BIT | S1 | S4 | S7 | S10 | S13 | S15 | S17 | S19 | S21 |
| SECOND BIT | S2 | S5 | S8 | S11 | S14 | S16 | S18 | S20 | S22 |
| THIRD BIT | S3 | S6 | S9 | S12 | P2-3 | P2-4 | P2-5 | P2-6 | P2-7 |
| FOURTH BIT | P2-1 | P1-1 | P2-2 | P1-2 | P1-3 | P1-4 | P1-5 | P1-6 | P1-7 |

FIG. 20

SYMBOL →

| | | | | | | | | |
|---|---|---|---|---|---|---|---|---|
| FIRST BIT | S1 | S4 | S7 | S10 | S13 | S15 | S17 | S19 | S21 |
| SECOND BIT | S2 | S5 | S8 | S11 | S14 | S16 | S18 | S20 | S22 |
| THIRD BIT | S3 | S6 | S9 | S12 | P2-3 | P2-4 | P2-5 | P2-6 | P2-7 |
| FOURTH BIT | P2-1 | P1-1 | P2-2 | P1-2 | P1-3 | P1-4 | P1-5 | P1-6 | P1-7 |

FIG. 21

SYMBOL →

| | | | | | | | | |
|---|---|---|---|---|---|---|---|---|
| FIRST BIT | S1 | S4 | S7 | S10 | S13 | S15 | S17 | S19 | S21 |
| SECOND BIT | S2 | S5 | S8 | S11 | S14 | S16 | S18 | S20 | S22 |
| THIRD BIT | S3 | S6 | S9 | S12 | P2-1 | P1-1 | P2-2 | P1-2 | P2-3 |
| FOURTH BIT | P1-3 | P2-4 | P1-4 | P2-5 | P1-5 | P2-6 | P1-6 | P2-7 | P1-7 |

FIG. 23

| | SYMBOL → | | | | | | | | |
|---|---|---|---|---|---|---|---|---|---|
| FIRST BIT | S1 | S4 | S7 | S10 | S13 | S16 | S19 | S22 | S25 |
| SECOND BIT | S2 | S5 | S8 | S11 | S14 | S17 | S20 | S23 | S26 |
| THIRD BIT | S3 | S6 | S9 | S12 | S15 | S18 | S21 | S24 | S27 |
| FOURTH BIT | P2-1 | P1-1 | P2-2 | P1-2 | P2-3 | P1-3 | P2-4 | P1-4 | P2-5 |

FIG. 27

| | SYMBOL → | | | | | | | | |
|---|---|---|---|---|---|---|---|---|---|
| FIRST BIT | S1 | S2 | S3 | S4 | S5 | P2-1 | P1-1 | P2-2 | P1-2 |
| SECOND BIT | P2-3 | P1-3 | P2-4 | P1-4 | P2-5 | P1-5 | P2-6 | P1-6 | P2-7 |
| THIRD BIT | P1-7 | P2-8 | P1-8 | P2-9 | P1-9 | P2-10 | P1-10 | P2-11 | P1-11 |

FIG. 29

| | SYMBOL → | | | | | | | | |
|---|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-1 | P1-1 | P2-2 | P1-2 | P2-3 | P1-3 |
| THIRD BIT | P2-4 | P1-4 | P2-5 | P1-5 | P2-6 | P1-6 | P2-7 | P1-7 | P2-8 |

FIG. 31

| | SYMBOL → | | | | | | | | |
|---|---|---|---|---|---|---|---|---|---|
| FIRST BIT | S1 | S4 | S7 | S10 | S13 | S15 | S17 | S19 | S21 |
| SECOND BIT | S2 | S5 | S8 | S11 | S14 | S16 | S18 | S20 | S22 |
| THIRD BIT | S3 | S6 | S9 | S12 | P2-1 | P1-1 | P2-2 | P1-2 | P2-3 |

| (RATIO BETWEEN SYSTEMATIC BITS AND PARITY BITS) | AMPLITUDE RATIO | ANGLE |
|---|---|---|
| $R(0) \sim R(1)$ | $a(1)$ | $\theta(1)$ |
| $R(1) \sim R(2)$ | $a(2)$ | $\theta(2)$ |
| ⋮ | ⋮ | ⋮ |
| ⋮ | ⋮ | ⋮ |
| $R(n-1) \sim R(n)$ | $a(n)$ | $\theta(n)$ |

FIG. 42

| | | | | | | | | |
|---|---|---|---|---|---|---|---|---|
| FIRST BIT | S1 | S3 | S5 | S7 | S8 | S9 | S10 | S11 | S12 |
| SECOND BIT | S2 | S4 | S6 | P2-4 | P1-5 | P2-7 | P1-8 | P2-10 | P1-11 |
| THIRD BIT | P2-1 | P2-2 | P2-3 | P1-4 | P2-6 | P1-7 | P2-9 | P1-10 | P2-12 |
| FOURTH BIT | P1-1 | P1-2 | P1-3 | P2-5 | P1-6 | P2-8 | P1-9 | P2-11 | P1-12 |

(CODING RATIO = 1/3)

(1)

(2)

(3)

(4)

(1)

(2)

(3)

(4)

(1)

(2)

(3)

(4)

(1)

(2)

(3)

DIGITAL RADIO COMMUNICATIONS METHOD USING MULTI-LEVEL MODULATION SCHEME AND TRANSMITTER AND RECEIVER

This application is a continuation of International Application No. PCT/JP05/023956, filed Dec. 27, 2005, now pending, the contents of which are incorporated by reference.

TECHNICAL FIELD

The present invention relates to a digital radio communications system employing the multi-level modulation scheme and also to a transmitter and a receiver. The invention relates, for example, to the technology suitable for use in a digital radio communications system using bit correction processing.

BACKGROUND ART

Recent digital radio communications systems employ the multi-level modulation scheme such as QPSK (Quadrature Phase Shift Keying), 8PSK, and 16QAM (Quadrature Amplitude Modulation) in order to enable high-speed transmission while effectively using limited radio frequency bands. That is, QPSK is capable of transmitting two bits by a single symbol; 8PSK is capable of transmitting three bits by a single symbol; 16QAM is capable of transmitting four bits by a single symbol. In this manner, by means of increasing the number of such multi-levels, the amount of information transmitted by a single symbol is increased, high-speed transmission being thereby realized.

Such multi-level modulation schemes arranges symbols in such a manner that distances among symbols (signal points) are equal with respect to rectangular coordinates of a real axis (I axis) and an imaginary axis (Q axis), that is, distances among symbols (signal points) are equal on a complex plane (IQ plane), in terms of lowering a symbol evaluation error (code error rate) on the receiver end as much as possible. For example, as to 16QAM, the following types are well known: a grid-like arrangement of 16 symbols at equal intervals in a grid-like arrangement (hereinafter will be called "grid-like 16QAM") as shown in FIG. 36; a concentric type arrangement in which four symbols are arranged on the inner circle, of the double circles on a complex plane, and 12 symbols are arranged on the outer circle at the same intervals [hereinafter will be called "(4, 12) circular 16QAM"] as shown in FIG. 37; and another concentric type arrangement in which eight symbols are arranged at the same intervals on the respective same circles, the double concentric circles, on a complex plane [hereinafter will be called (8, 8) star 16QAM"] as shown in FIG. 38. Further, 8QPSK arranges eight symbols at the same intervals on a circle on a complex plane as shown in FIG. 39.

In this instance, in the symbol arrangement shown in FIG. 36, a distance ratio between a symbol close to the I axis and the Q axis to a symbol apart from those axes are given as 1:3; a radius ratio of the inner circle to the outer circle shown in FIG. 37 and FIG. 38 is given as 1:r. Such ratios should by no means be limited to these. Further, as to (4, 12) circular 16QAM shown in FIG. 37 and (8, 8) star 16QAM shown in FIG. 38, researches thereof have been proceeded from therebefore, and descriptions of such researches are made in the following non-patent documents 1 through 4.

[A] Bit Allocation (Mapping) Method to Symbols in the Multi-Level Modulation Scheme:

Here, a description will be made of a bit allocation (mapping) method in the above described grid-like 16QAM, (4, 12) circular 16QAM, (8, 8) star 16QAM, and 8PSK, with reference to FIG. 43 through FIG. 47. In this instance, in FIG. 43 through FIG. 46, a white dot indicates a bit (code) of "0"; a black dot indicates a bit of "1".

(A1) Grid-Like 16QAM:

In a case of grid-like 16QAM, bit allocation as shown in FIG. 43, for example, is performed.

That is, as to the first bit, a bit of "1" is allocated to the first bit of each of the eight symbols arranged in the area of the left side of the Q axis [the negative area of the I axis (real axis)] on the paper, by means of quadrant decision with respect to the Q axis (imaginary axis) on the IQ plane, and a bit of "0" is allocated to the first bit of each of the eight symbols arranged on the right side (the positive area of the I axis) on the paper as shown in (1) of FIG. 43. As to the second bit, a bit of "0" is allocated to the second bit of each of the eight symbols of the upper side area of the I axis (the positive area of the Q axis) on the paper, and a bit of "1" is allocated to the second bit of each of the eight symbols of the lower side area of the I axis (the negative area of the Q axis) on the paper by means of quadrant decision with respect to the I axis as shown in (2) of FIG. 43.

Further, as to the third bit, a bit of "0" is allocated to the third bit of each of the eight symbols close to the Q axis and a bit of "1" is allocated to the third bit of each of the eight symbols apart from the Q axis, by means of distance decision from the Q axis as shown in (3) of FIG. 43. As to the fourth bit, a bit of "0" is allocated to the fourth bit of each of the eight symbols close from the I axis and a bit of "1" is allocated to the third bit of each of the eight symbols apart from the I axis, by means of distance decision from the I axis as shown in (4) of FIG. 43.

To map bits to symbols with such a method brings about a bit series allocated to each symbol as shown FIG. 47, for example, so that the bit series of adjacent symbols differ from each other only by one bit. This makes it possible to suppress a probable error down to one bit, even if the receiver end erroneously receives the adjacent symbol due to noise. In this instance, such a mapping method in which adjacent symbols differ from each other by only one bit is called "gray-mapping".

(A2) (4, 12) Circular 16QAM:

In a case of circular 16QAM, bit allocation as shown in FIG. 44, for example, is performed.

That is, as to the first bit, a bit of "1" is allocated to the first bit of each of the eight symbols arranged on each of the circles in the area of the left side of the Q axis (the negative area of the I axis) on the paper, by means of quadrant decision with respect to the Q axis on an IQ plane, and a bit of "0" is allocated to the first bit of each of the eight symbols arranged on each of the circles of the right side area of the Q axis (the positive area of the I axis) on the paper as shown in (1) of FIG. 44. As to the second bit, a bit of "0" is allocated to the second bit of each of the eight symbols on each of the circles in the upper area of the I axis (the positive area of the Q axis) on the paper, and a bit of "1" is allocate to the second bit of each of the eight symbols on each of the circles in the lower area of the I axis (the negative area of the Q axis) on the paper, by means of quadrant decision with respect to the I axis as shown in (2) of FIG. 44.

Further, as to the third bit, a bit of "0" is allocated to the third bit of each of the eight symbols on the circle close to the Q axis, and a bit of "1" is allocated to the third bit of each of the eight symbols on the circle apart from the Q axis, by means of distance decision from the Q axis as shown in (3) of FIG. 44. As to the fourth bit, a bit of "0" is allocated to the fourth bit of each of the eight bits on the circle close from the I axis and a bit of "1" is allocated to the fourth bit of each of the eight symbols on the circle apart from the I axis, by means of distance decision from the I axis as shown in (4) of FIG. 44.

That is, in the above described grid-like 16QAM and (4, 2) circular 16QAM, bit allocation is performed to the first bits and to the second bits by means of quadrature decision with respect to the I axis and the Q axis, and bit allocation to the third bit and the fourth bit is performed by means of distance evaluation with respect to the I axis and the Q axis. The first bit and the second bit, and the third bit and the fourth bit, each have the same likelihood (quality), but the likelihood of the first bit and the second bit differs from the likelihood of the third bit and the fourth bit (the likelihood is lower than that of the first bit and the second bit).

(A3) (8, 8) Star 16QAM:

In a case of (8, 8) star 16QAM, bit allocation as shown in FIG. 45, for example, is performed.

That is, as to the first bit, a bit of "1" is allocated to the first bit of each of the eight symbols arranged on each of the circles in the area of the left side of the Q axis (the negative area of the I axis) on the paper, by means of quadrature decision with respect to the Q axis on the IQ plane, and a bit of "0" is allocated to the first bit of each of the eight symbols arranged on each of the circles of the right side area of the Q axis (the positive area of the I axis) on the paper by means of quadrant decision with respect to the I axis as shown in (1) of FIG. 45. As to the second bit, a bit of "0" is allocated to the second bit of each of the eight symbols on each of the circles in the upper area of the I axis (the positive area of the Q axis) on the paper, by means of quadrant decision with respect to the I axis as shown in (2) of FIG. 45, and a bit of "1" is allocate to the second bit of each of the eight symbols on each of the circles in the lower area of the I axis (the negative area of the Q axis) on the paper, by means of quadrant decision with respect to the I axis as shown in (2) of FIG. 45.

Further, as to the third bit, a bit of "0" is allocated to the third bit of each of the eight symbols on each of the circles arranged in the first quadrant and the third quadrant, and a bit of "1" is allocated to the third bit of each of the eight symbols on each of the circles arranged in the second quadrant and the fourth quadrant, with the evaluation reference the same as that of the third bit in a case of 8PSK, which will be described later, that is, by means of quadrant decision of a diagonal angle obtained by rotating (for example, right-handed rotation) the I axis and the Q axis 45 degrees as shown in (3) of FIG. 45. As to the fourth bit, a bit of "0" is allocated to the fourth bit of each of the eight symbols on the inner circle close to the origin point, and bit "1" is allocated to the fourth bit of each of the eight symbols on the outer circle apart from the origin point, by means of evaluation of a distance from the origin point, as shown in (4) of FIG. 45.

Accordingly, in a case of (8, 8) star 16QAM, the likelihood of the first bit is the same as the likelihood of the second bit, and the likelihood of the first bit and the second bit differs from the likelihood of the third bit and the fourth bit (lower than that of the first bit and the second bit). In addition, the likelihood of the third bit differs from that of the fourth bit. That is, (8, 8) likelihood has a three-stage likelihood.

(A4) 8PSK:

In a case of 8PSK (a single symbol is transmitted using three bits), bit allocation as shown in FIG. 46, for example, is performed.

That is, as to the first bit, a bit of "1" is allocated to the first bit of each of the eight symbols arranged on the circle in the area of the left side of the Q axis (the negative area of the I axis) on the paper, by means of quadrant decision with respect to the Q axis on the IQ plane, and a bit of "0" is allocated to the first bit of each of the eight symbols arranged on the circle of the area of the right side of the Q axis (the positive area of the I axis) on the paper as shown in (1) of FIG. 46. As to the second bit, a bit of "0" is allocated to the second bit of each of the eight symbols on the circle in the upper area of the I axis (the positive area of the Q axis) on the paper, and bit "1" is allocate to the second bit of each of the eight symbols on the circle in the lower area of the I axis (the negative area of the Q axis) on the paper, by means of quadrant decision with respect to the I axis as shown in (2) of FIG. 46.

Further, as to the third bit, a bit of "0" is allocated to the third bit of each of the eight symbols on the circle arranged in the first quadrant and the third quadrant, and a bit of "1" is allocated to the third bit of each of the eight symbols on the circle in the second quadrant and the fourth quadrant, as shown in (3) of FIG. 46, by means of quadrant decision of a diagonal angle obtained by rotating (for example, right-handed rotation) the I axis and the Q axis 45 degrees as shown in (3) of FIG. 46.

[B] System Using Turbo Code and Bit Correction Method:

As described above, in the multi-level modulation scheme, a difference of likelihood (quality) corresponding to a difference of a symbol evaluation reference in a single symbol is generated among the bits, that is, bits vulnerable to an error and bits resistant to an error are generated (generally speaking, in comparison with the first bit and the second bit allocated by means of quadrant decision with respect to the I axis and the Q axis, the third bit and the fourth bit are vulnerable to an error). Hence, as described in the following patent document 1, mapping performed without paying consideration to the quality of each bit can deteriorate the performance of decoding result on the receiver end, depending on the coding scheme.

For example, as shown in FIG. 40, a turbo coder transmits an information series [systematic bits (systematic codes)] S which is not coded and also a coded bit series [parity bits (parity codes)], such as a bit series (parity bits P1) coded by an element coder 101 and a bit series (parity bits P2) obtained by coding an information series interleaved by an interleaver 103 by an element coder 102. As described in the following patent document 1, mapping of these systematic bits and parity bits without paying consideration to the quality of each of the bits in a single symbol results in deterioration of the quality of the systematic bits in spite of the fact that the quality of systematic bits exhibits a larger effect (significance is high) to the performance of the decoding result than the quality of parity bits, so that the performance of the decoding result is deteriorated.

That is, on the receiver end (turbo decoder), as shown in FIG. 41, for example, the element decoder 201 performs decoding (soft decision) using systematic bits S and one kind of parity bits P1. After the interleaver 204 interleaves the obtained result, another element decoder 202 performs decoding thereof using systematic bits S and the other kind of parity bits P2. The deinterleaver 205 deinterleaves the decoding result, and then feedbacks the obtained result to the element decoder 201. This process is repeated a predetermined number of times, thereby performing decoding processing of turbo codes. Then, in order to finally obtain a decoded series as a result of deinterleaving the decoded result obtained by the element decoder 202 by use of the deinterleaver 206, the systematic bits S are used by the two element decoders 201 and 202, so that the effect of systematic bits S on the performance of the decoding result is greater than the effect of the quality of parity bits. In this instance, a system employing turbo coding is also described in the following patent document 2.

Thus, in systems using turbo coding, it is normally preferable that processing called bit correction be performed for improving decoding characteristic. It makes possible for systematic bits S, whose significance is higher than that of parity bits P, to be mapped to bits whose quality is high in a symbol [For example, see Chapter 4.5.4.4 (HARQ bit correction) of the following non-patent document 5]. That is, in 16QAM, of the above mentioned various types of mapping methods, as shown in FIG. 42, for example, the first bit and the second bit are superior in quality to the third bit and the fourth bit because the first and the second bit are quadrant decision in a symbol. Thus, systematic bits S and parity bits P are sequentially allocated in the vertical direction (beginning from the highest order bit toward the lowest order bit) of the paper sheet of FIG. 42, beginning from the left end row of the paper sheet as indicated by the dotted arrow so that systematic bits are allocated to the first and the second bits with high priority. In this instance, this FIG. 42 illustrates an example in which turbo coding is performed at a coding ratio=1/3. Systematic bits S are shown as S1 through S12; one kind of parity bits (obtained by the element coder 101; for example) are showed as P1-1 through P1-12; another kind of parity bits (obtained by the element coder 102) are showed as P2-1 through P2-12 (the same goes for the description hereinafter).

Patent Document 1: Japanese Patent Application Laid-open No. 2002-171298;

Patent Document 2: Japanese Patent Application Laid-open No. 2003-78419;

Non-patent Document 1: Oshita and Kondo, "Optimal Signal Point Arrangement in the 16-level Amplitude Phase Modulation Scheme", IEICE TRANSACTIONS on Fundamentals of Electronics, Communications and Computer Sciences, August, 1989;

Non-patent Document 2: Machida, Handa, and Oshita, "(4, 12)-Type Concentric Circle Signal Arrangement and Reception Characteristic thereof in the 16-ary Amplitude Phase Modulation Scheme", IEICE TRANSACTIONS on Fundamentals of Electronics, Communications and Computer Sciences, October, 1997;

Non-patent Document 3: F. Adachi, M. Sawahashi, "Performance Analysis of Various 16 Level Modulation Schemes under Rayleigh Fading"

Non-patent Document 4: Suzuki and Mizuno, "Multi-symbol Delay Wave Detection Scheme for Differential Motion Coding Amplitude Modulation Signals and Application thereof to 16DAPSK", IEICE TRANSACTIONS on Fundamentals of Electronics, Communications and Computer Sciences, December, 1994; and Non-patent Document 5: 3GPP TS 25.212 V5.2.0 (2002-09)

DISCLOSURE OF THE INVENTION

Issues to be Solved by the Present Invention

As already described, the concentric circle signal point arrangements of (4, 12) circular 16QAM and (8, 8) star 16QAM in which neighbouring symbols on the same circle are positioned at equal intervals are optimum in terms of distances among symbols. In a case of the grid-like 16QAM, an arrangement of 16 points (symbols) at equal intervals is optimal in terms of distances among symbols.

However, in a case in which the above described turbo coding and bit correction processing are used in combination, it cannot be said that such signal point arrangement at equal intervals are necessarily optimal in terms of an error rate. In addition, bit correction processing cannot be said to be necessarily optimal.

The present invention is proposed in view of these issues. One object of the preset invention is to improve an error rate by means of controlling signal points (symbols) arrangement with the previous multi-level modulation scheme for performing transmission so as to make the best use of the effect of bit correction processing.

Means to Solve the Issues

In order to accomplish the above object, the present invention provides the following digital radio communications method which employs the following multi-level modulation scheme, transmitter, and receiver.

(1) As a generic aspect, there provided is a digital radio communications method using the multi-level modulation scheme for use in a digital radio communications system including: a transmitter which transmits a signal modulated with the multi-level modulation scheme in which a single symbol is transmitted using a plurality of bits; and a receiver which demodulates the reception signal received from the transmitter by means of performing symbol evaluation, the radio communications method comprising: on the transmitter, performing a coding process of coding an information series to be transmitted, to generate multiple codes which are different in significance; performing a bit correction process of controlling bit arrangement in such a manner that a code whose significance is high, out of the multiple codes obtained by the coding process, is allocated with high priority to a bit having a tendency such that the likelihood of the bit at the symbol evaluation performed on the receiver becomes large; performing a multi-level modulation process of allocating the code to the plurality of bits in accordance with a bit arrangement obtained in the bit correction process to perform multi-level modulation of the information series at a predetermined symbol arrangement; and performing a symbol arrangement control process of controlling the symbol arrangement in a direction such that the symbol arrangement is changed from an equal distance arrangement in accordance with a ratio of the codes different insignificance in the bit correction process, and on the receiver, demodulating a signal received from the transmitter based on information relating to the changed symbol arrangement; and performing a decoding process of decoding the demodulated signal to obtain the information series.

(2) As a preferred aspect, the method may comprise: in the symbol arrangement control process performed by the transmitter, controlling the symbol arrangement in a direction such that the likelihood of a bit to which a code high in significance is allocated, out of the plurality of bits, becomes large.

(3) As another preferred aspect, the method may comprise: in the symbol arrangement control process performed by the transmitter, controlling the symbol arrangement in a direction such that the likelihood of a bit to which a code low in significance is allocated, out of the plurality of bits, becomes large.

(4) As yet another preferred aspect, the digital radio communications method, which is the 16-ary modulation scheme in which a single symbol is transmitted using four bits, a first through a fourth bit, may comprise: in the symbol arrangement control process, controlling the symbol arrangement in a direction such that, in a case where the code high in significance is allocated only to the first bit by the bit arrangement performed in the bit correction process, the likelihood of only the first bit becomes large.

(5) As still another preferred aspect, the digital radio communications method, which is the 16-ary modulation scheme in which a single symbol is transmitted using four bits, a first through a fourth bit, may comprise: in the symbol arrangement control process, controlling the symbol arrangement in a direction such that, in a case where the code high in significance is allocated to the first bit and to the second bit by the bit arrangement performed in the bit correction process, the likelihood of the first bit and the second bit becomes large.

(6) As a further preferred aspect, the digital radio communications method, which is the 16-ary modulation scheme in which a single symbol is transmitted using four bits, a first through a fourth bit, may comprise: in the symbol arrangement control process, controlling the symbol arrangement in a direction such that, in a case where the code high in significance is allocated to the first bit through the third bit by the bit arrangement performed in the bit correction process, the likelihood of the third bit and the fourth bit becomes large.

(7) As a yet further preferred aspect, the digital radio communications method, which is the 16-ary modulation scheme in which a single symbol is transmitted using four bits, a first through a fourth bit, may comprise: in the symbol arrangement control process, controlling the symbol arrangement in a direction such that, in a case where the code high in significance is allocated only to the fourth bit by the bit arrangement performed in the bit correction process, the likelihood of only the fourth bit becomes large.

(8) As a still further preferred aspect, digital radio communications method, which is the 8-ary modulation scheme in which a single symbol is transmitted using three bits, a first through a third bit, may comprise: in the symbol arrangement control process, controlling the symbol arrangement in a direction such that, in a case where the code high in significance is allocated only to the first bit by the bit arrangement performed in the bit correction process, the likelihood of only the first bit becomes large.

(9) As another preferred aspect, the digital radio communications method, which is the 8-ary modulation scheme in which a single symbol is transmitted using three bits, a first through a third bit, may comprise: in the symbol arrangement control process, controlling the symbol arrangement in a direction such that, in a case where the code high insignificance is allocated to the first bit and to the second bit by the bit arrangement performed in the bit correction process, the likelihood of the first bit and the second bit becomes large.

(10) As yet another preferred aspect, the digital radio communications method, which is the 8-ary modulation scheme in which a single symbol is transmitted using three bits, a first through a third bit, may comprise: in the symbol arrangement control process, controlling the symbol arrangement in a direction such that, in a case where the code low in significance is allocated only to the third bit by the bit arrangement performed in the bit correction process, the likelihood of only the fourth bit becomes large.

(11) As still another preferred aspect, the method may comprise: in the on the symbol arrangement control process, controlling the symbol arrangement in a direction such that a transmission power is not changed before and after the change of the symbol arrangement.

(12) As a further preferred aspect, the method may comprise: in the bit correction process, controlling the bit arrangement in such a manner that a ratio of a plurality of types of codes low in significance, out of the multiple codes, is equal for every one of the plurality of bits.

(13) As a yet further preferred aspect, the transmitter may further comprise a process of notifying the receiver beforehand of information relating to a symbol arrangement changed in the symbol arrangement control process.

(14) As a still further preferred aspect, the receiver may hold information beforehand relating to the symbol arrangement with respect to a ratio of codes different in significance in a memory; the transmitter is operable to perform the process of notifying the receiver of information relating to the ratio; and the receiver is operable to perform the process of reading the information relating to the symbol arrangement based on information relating to the ratio notified from the transmitter, and the process of executing the demodulation based on the read out information.

(15) As another preferred aspect, the code high in significance may be a systematic code in a turbo code, and the code low in significance may be a parity code in the turbo code.

(16) As another generic aspect, there provided is transmitter for use in a digital radio communications system including: a transmitter which transmits a signal modulated with the multi-level modulation scheme in which a single symbol is transmitted using a plurality of bits; and a receiver which performs symbol evaluation of a reception signal from the transmitter and demodulates the reception signal received from the transmitter, the transmitter comprising: a coding means which codes an information series to be transmitted, to generate multiple codes different in significance; a bit correction means which controls bit arrangement in such a manner that a code whose significance is high, out of the multiple codes, is allocated with high priority to a bit having a tendency such that the likelihood of the bit at the symbol evaluation performed on the receiver becomes large; a multi-level modulation means which allocates the code to the plurality of bits in accordance with a bit arrangement obtained by the bit correction means to perform multi-level modulation of the information series with a predetermined symbol arrangement; and a symbol arrangement controlling means which controls the symbol arrangement in a direction such that the symbol arrangement is changed from an equal distance arrangement in accordance with a ratio of codes different in significance in the bit correction means.

(17) As a preferred aspect, the symbol arrangement controlling means may control the symbol arrangement in a direction such that the likelihood of a bit to which a code high in significance is allocated, out of the plurality of bits, becomes large.

(18) As another preferred aspect, the symbol arrangement controlling means may control the symbol arrangement in a direction such that the likelihood of a bit, out of the plurality of bits, to be allocated with low priority becomes large.

(19) As yet another preferred aspect, when the transmitter employs the multi-level modulation scheme which is the 16-ary modulation method that transmits a single symbol using four bits, a first bit through a fourth bit, the symbol arrangement controlling means may control the symbol arrangement in a direction such that, in a case where the code high in significance is allocated only to the first bit by the bit arrangement performed by the bit correction means, the likelihood of only the first bit becomes large.

(20) As still another preferred aspect, when the transmitter employs the multi-level modulation scheme which is the 16-ary modulation scheme that transmits a single symbol using four bits, a first bit through a fourth bit, the symbol arrangement controlling means may control the symbol arrangement in a direction such that, in a case where the code high in significance is allocated to the first bit and to the second bit by the bit arrangement performed by the bit correction means, the likelihood of the first bit and the second bit becomes large.

(21) As a further preferred aspect, when the transmitter employs the multi-level modulation scheme which is the 16-ary modulation method that transmits a single symbol using four bits, a first bit through a fourth bit, the symbol arrangement controlling means may control the symbol arrangement in a direction such that, in a case where the code with high priority is allocated to the first bit through the third bit by the bit arrangement performed by the bit correction means, the likelihood of the third bit and the fourth bit becomes large.

(22) As a yet further preferred aspect, the transmitter employs the multi-level modulation scheme which is the 16-ary modulation method that transmits a single symbol using four bits, a first bit through a fourth bit, the symbol arrangement controlling means may control the symbol arrangement in a direction such that, in a case where the code low in significance is allocated only to the fourth bit by the bit arrangement performed by the bit correction means, the likelihood of only the fourth bit becomes large.

(23) As a still further preferred aspect, when the transmitter employs the multi-level modulation scheme which is the 8-ary modulation method that transmits a single symbol using three bits, a first bit through a third bit, the symbol arrangement controlling means may control the symbol arrangement in a direction such that, in a case where the code high in significance is allocated only to the first bit by the bit arrangement performed by the bit correction means, the likelihood of only the first bit becomes large.

(24) As another preferred aspect, when the transmitter employs the multi-level modulation scheme which is the 8-ary modulation method that transmits a single symbol using three bits, a first bit through a third bit, the symbol arrangement controlling means may control the symbol arrangement in a direction such that, in a case where the code high insignificance is allocated to the first bit and to the second bit by the bit arrangement performed by the bit correction means, the likelihood of the first bit and the second bit becomes large.

(25) As yet another preferred aspect, when the transmitter employs the multi-level modulation scheme which is the 8-ary modulation method that transmits a single symbol using three bits, a first bit through a third bit, the symbol arrangement controlling means may control the symbol arrangement in a direction such that, in a case where the code low in significance is allocated only to the third bit by the bit arrangement performed by the bit correction means, the likelihood of only the fourth bit becomes large.

(26) As still another preferred aspect, the symbol arrangement controlling means may control the symbol arrangement in a direction such that a transmission power is not changed before and after the change of the symbol arrangement.

(27) As a further preferred aspect, the bit correction means may control the bit arrangement in a direction such that a ratio of a plurality of types of codes low in significance, out of the multiple codes, is equal for every one of the plurality of bits.

(28) As a yet further preferred aspect, the transmitter may further comprise a notifying means which notifies the receiver beforehand of information relating to a symbol arrangement changed by the symbol arrangement controlling means.

(29) As a still further preferred aspect, the code high in significance may be a systematic code in a turbo code, and the code low in significance may be a parity code in the turbo code.

(30) As yet another generic aspect, there provided is a receiver for use in a digital radio communication system including: a transmitter which transmits a signal modulated with the multi-level modulation scheme in which a single symbol is transmitted using a plurality of bits; and a receiver which performs symbol evaluation of a reception signal from the transmitter and demodulates the reception signal received from the transmitter, the transmitter comprising: a demodulating means which demodulates a signal received from the transmitter based on information relating to the changed symbol arrangement that has been obtained by changing thereof, on the transmitter, from an equal distance arrangement in accordance with a ratio of the codes different in significance; and a decoding means which decodes the signal demodulated by the demodulation means to obtain an information series transmitted by the transmitter.

(31) As a preferred aspect, the receiver may further comprise a symbol arrangement information receiving means which receives information relating to the symbol arrangement from the transmitter.

(32) As another preferred aspect, the receiver may further comprise a memory which holds information relating to the symbol arrangement with respect to the ratio of codes different in significance, and the demodulating means reads information relating to the symbol arrangement from the memory based information relating to the ratio notified from the transmitter, and performs the demodulation based on the read out information.

Effects and Benefits of the Invention

The above described aspect realizes at least any one of the following effects and benefits.

(1) Since symbol arrangement is controlled to be changed from an equal interval arrangement to another arrangement in accordance with a ratio (for example, changes in accordance with a coding ratio) of codes different in significance obtained as a result of coding a information series to be transmitted, it is possible to make a code of high significance (or a code of low significance) resistant to an error. In consequence, the effect of bit correction processing can be exhibited sufficiently, so that an error rate of the multi-level modulation scheme is improved.

(2) Further, when a transmission electric power is made not to be changed before and after the change of symbol arrangement, it is possible to moderate increase in load (e.g. required amplification characteristic) due to average transmission power increase accompanying change of symbol arrangement in a transmitter.

(3) Furthermore, to control the bit arrangement in such a manner that a ratio of multiple types of codes low in significance, of the above mentioned multiple codes, becomes equal for each of the multiple bits in the bit correction process, contributes to further improvement of an error rate.

BRIEF DESCRIPTION OF THE DRAWINGS

FIG. 1 is a diagram illustrating an example of a bit arrangement with a bit correction method in the horizontal direction;

FIG. 3 is a diagram illustrating an example of bit arrangement (a coding ratio=1/9) with the bit correction method according to the first embodiment;

FIG. 4 is a diagram illustrating an example of a bit arrangement (a coding ratio=1/18) with a vertical bit correction method according to a first aspect of the first embodiment;

FIG. 5 is a diagram illustrating an example of a bit arrangement (a coding ratio=1/18) with a horizontal bit correction method according to the first aspect of the first embodiment;

FIG. 9 is a diagram illustrating an example of a bit arrangement with a vertical bit correction method according to a second aspect of the first embodiment;

FIG. 13 is a diagram illustrating an example of a bit arrangement with a vertical bit correction method in a case of (8, 8) star 16QAM in the second aspect of the first embodiment;

FIG. 14 is a diagram illustrating an example of bit arrangement with a horizontal bit correction method in a case of (8, 8) star 16QAM in the second aspect of the first embodiment;

FIG. 17 is a diagram illustrating an example of a bit arrangement with a bit correction method in the vertical direction according to a third aspect of the first embodiment;

FIG. 20 is a diagram illustrating an example of a bit arrangement with a vertical bit correction method in a case of (8, 8) star 16QAM in the third aspect of the first embodiment;

FIG. 21 is a diagram illustrating an example of bit arrangement with a horizontal bit correction method in a case of (8, 8) star 16QAM in the third aspect of the first embodiment;

FIG. 23 is a diagram illustrating an example of a bit arrangement with a bit correction method in the vertical direction according to a fourth aspect of the first modification;

FIG. 27 is a diagram illustrating an example of a bit arrangement with a horizontal bit correction method according to a fifth aspect of the first embodiment;

FIG. 29 is a symbol arrangement diagram for describing an example of symbol arrangement with a horizontal bit correction in the fifth aspect of the first embodiment;

FIG. 31 is a diagram illustrating an example of a bit arrangement with a horizontal bit correction method according to the fifth aspect of the first embodiment;

FIG. 42 is a diagram illustrating an example of a bit arrangement with a bit correction method;

DESCRIPTION OF REFERENCE CHARACTERS

Figure 2:
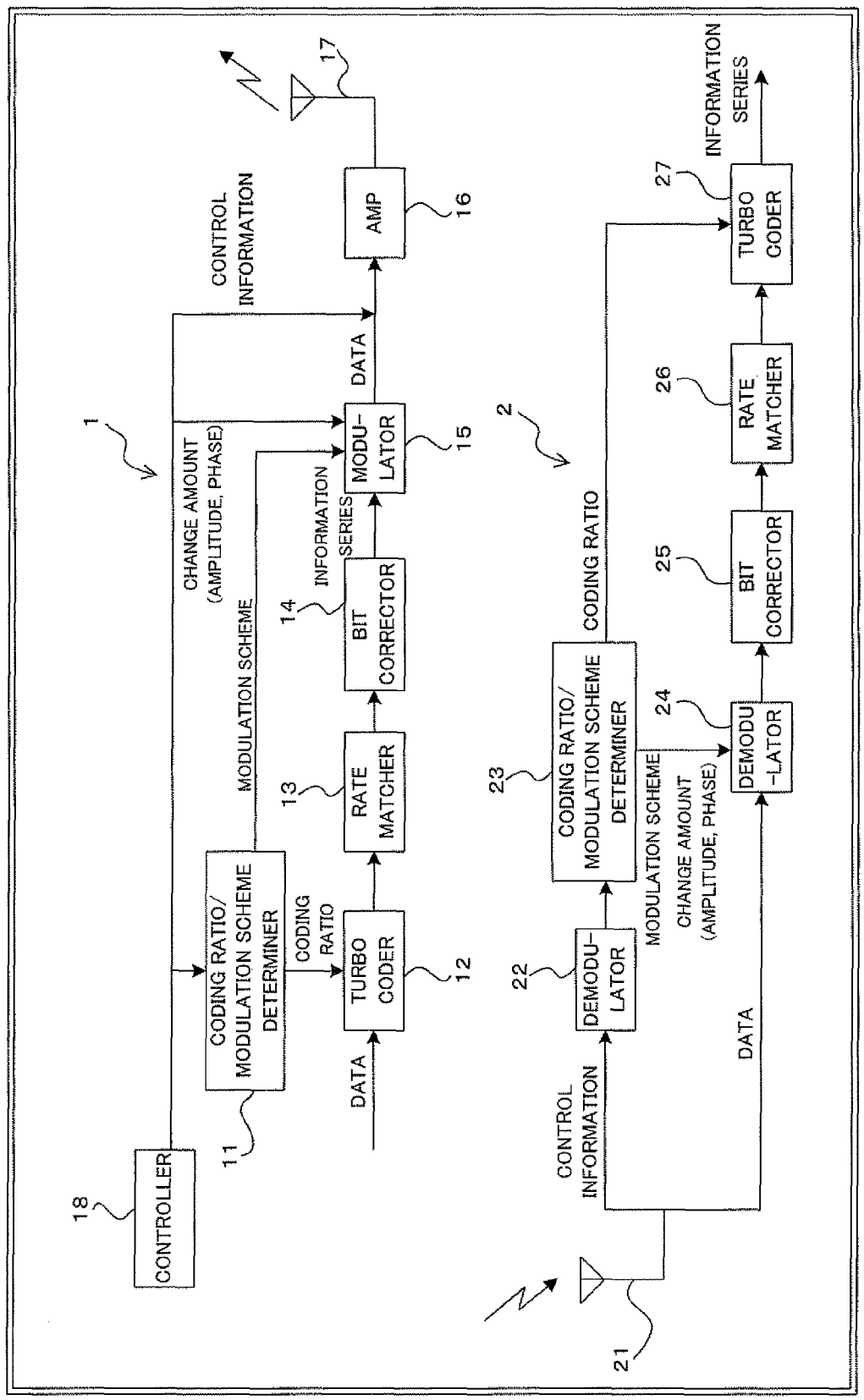
FIG. 2 is a block diagram illustrating a construction of a digital radio communication system using turbo coding and bit correction according to a first embodiment.

1 . . . transmitter
11 . . . coding ratio/modulation scheme determiner (transmission parameter determiner)
12 . . . turbo coder (turbo coding means)
13 . . . rate matcher
14 . . . bit corrector (bit correction means)
15 . . . modulator (multi-level modulating means)
16 . . . amplifier (AMP)
17 . . . transmitter antenna
18 . . . controller (symbol arrangement controlling means)
19 . . . amplitude/angle calculator (symbol control amount calculating unit)
2 . . . receiver
21 . . . receiver antenna
22 . . . demodulator (symbol arrangement information receiving means)
23 . . . coding ratio/modulation scheme determiner (transmission parameter determining unit)
24 . . . demodulator (demodulating means)
25 . . . bit corrector
26 . . . rate matcher
27 . . . turbo decoder (decoding means)
28 . . . amplitude/angle calculator (symbol control amount calculating unit)
191 . . . conversion table

BEST MODE FOR CARRYING OUT THE INVENTION

Embodiments will now be described with reference to the relevant accompanying drawings.

[1] Description of an Overview

The present method improves an error rate on a receiver end by means of moving (shifting) the positions of symbols, which are arranged at equal intervals in an existing method as described above, in a digital radio communications system employing the multi-level modulation scheme, for the purpose of increasing the effect of bit correction processing performed after coding. For example, control is performed in such a manner that the positions of symbols on the IQ plane are changed (moved/shifted) from the positions arranged at equal intervals so that the likelihood of a bit whose error resistance is expected to be increased.

In addition, the existing method of bit correction is also changed, depending on a coding ratio or a modulation scheme. For example, in a case where turbo codes are used, bit correction processing is controlled in such a manner that a ratio of allocation of multiple types of parity bits to each of the bits in a single symbol is averaged. As an example, the processing in which allocation is performed in the vertical direction [beginning from the first bit (the highest order bit) toward the lowest order bit in one symbol] as already described with reference to FIG. 42 is changed to the processing in which allocation is performed in the horizontal direction (see the dotted arrow) as shown, for example, in FIG. 1. This makes it possible to optimize the level of bit correction to a modulation scheme (it is possible to equalize the multiple types of parity bits for the bits of a single symbol).

[2] First Embodiment

FIG. 2 is a block diagram illustrating a construction of a digital radio communication system using turbo coding and bit correction according to a first embodiment of the present invention. The digital radio communications system of FIG. 2 includes a transmitter 1 and a receiver 2. The transmitter 1 is applicable, for example, to a radio base transceiving station (BTS); the receiver 2 is applicable, for example, to a mobile station (MS).

Figure 40:
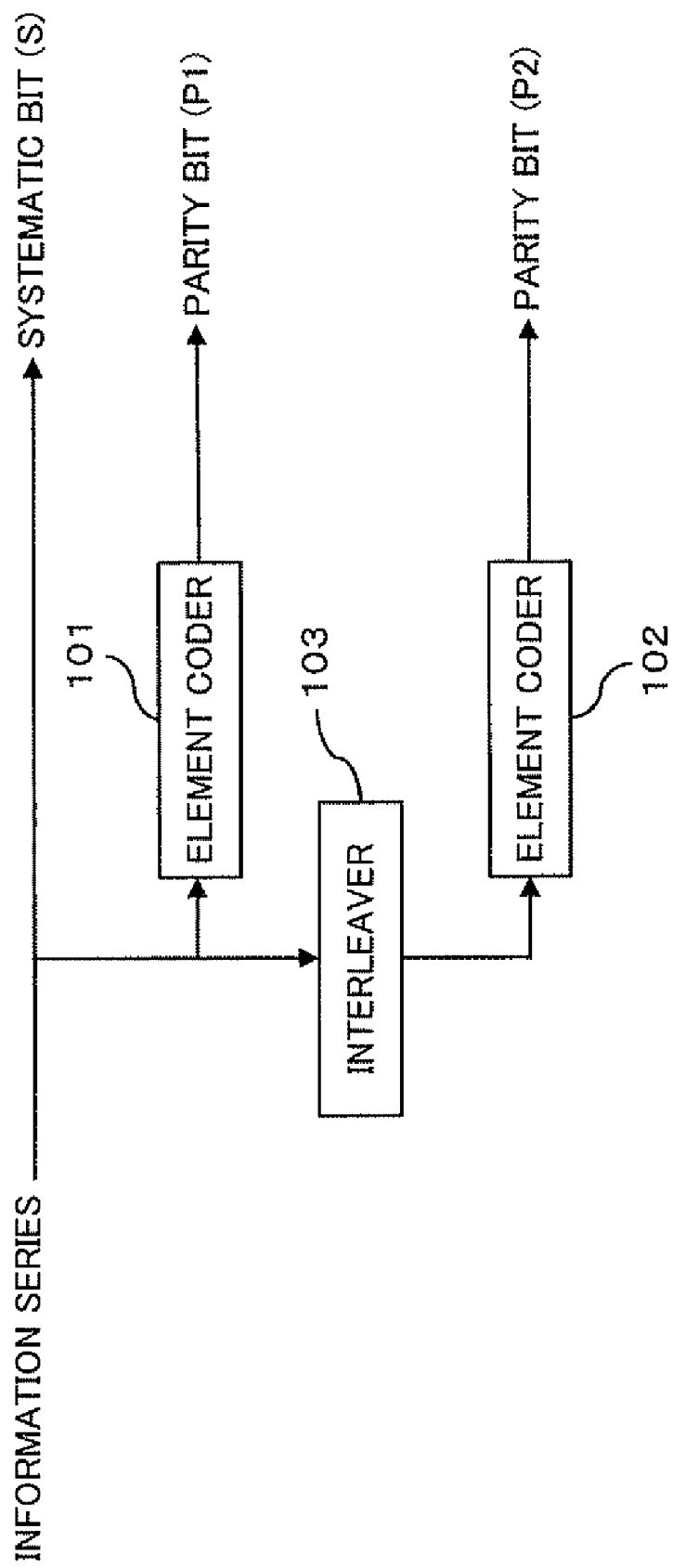
FIG. 40 is a block diagram illustrating a construction of a turbo coder.
Figure 41:
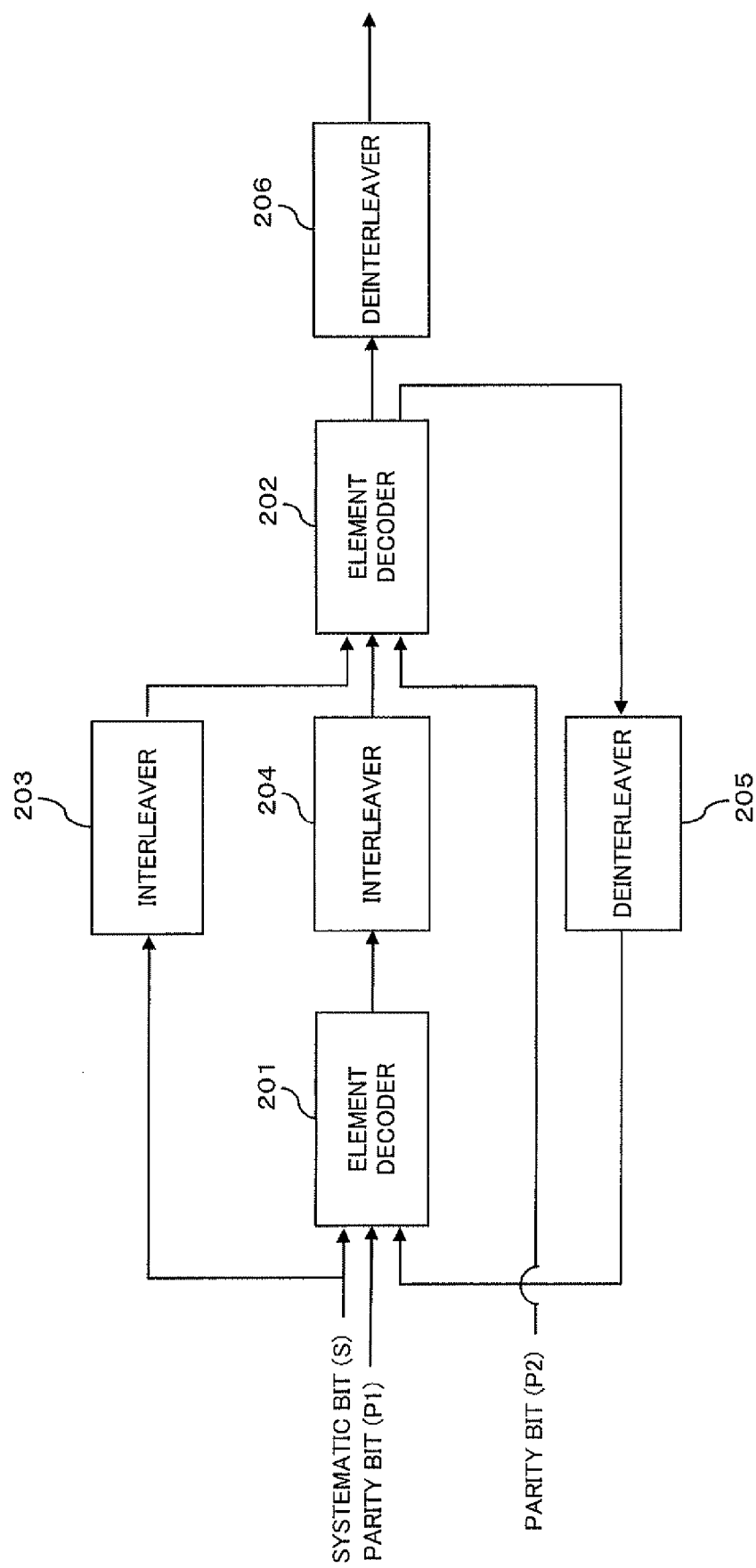
FIG. 41 is a block diagram illustrating a construction of a turbo decoder.
Figure 43:
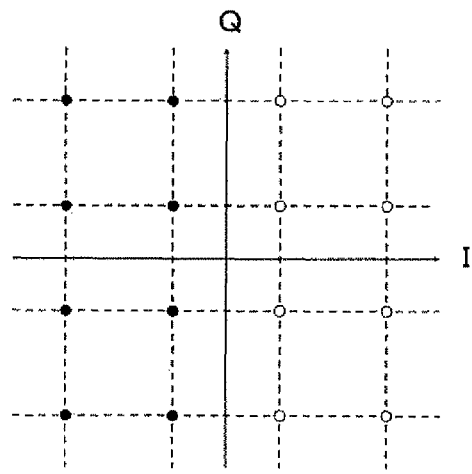
FIG. 43 is a diagram illustrating a symbol arrangement for describing a method of bit allocation (mapping) under grid-like 16QAM.
Figure 43:
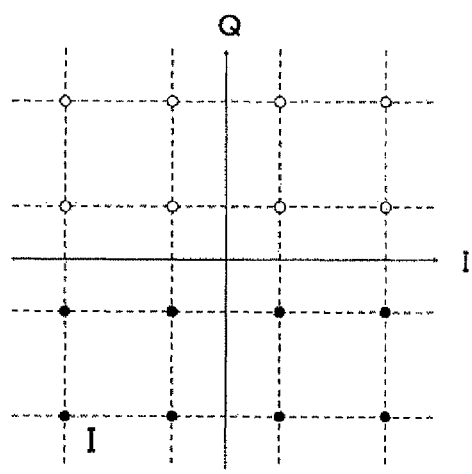
Figure 43:
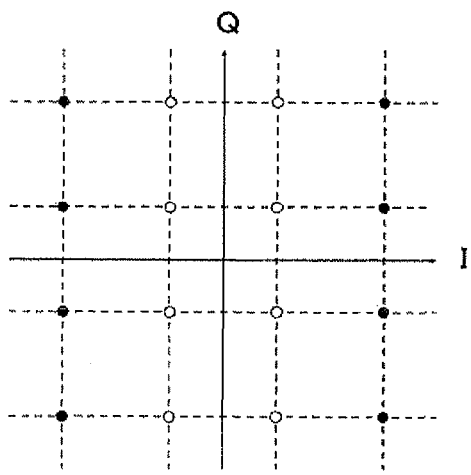
Figure 43:
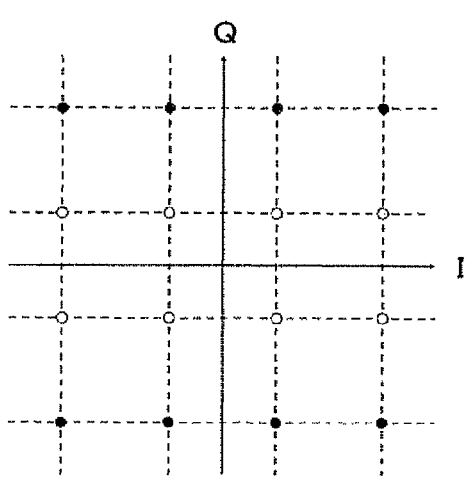
Figure 44:
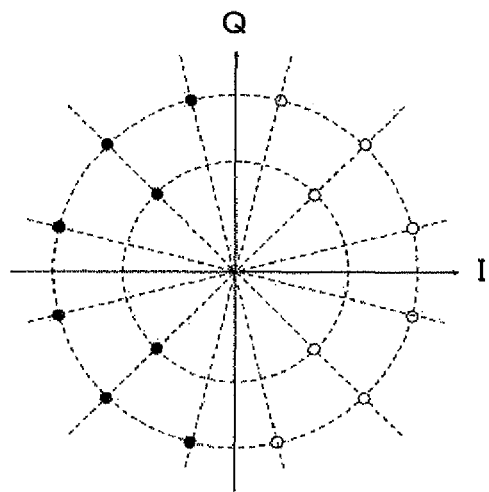
FIG. 44 is a diagram illustrating a symbol arrangement for describing a method of bit allocation (mapping) under (4, 12) circular 16QAM.
Figure 44:
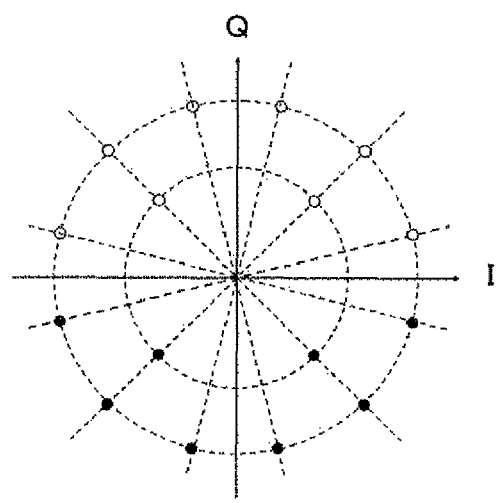
Figure 44:
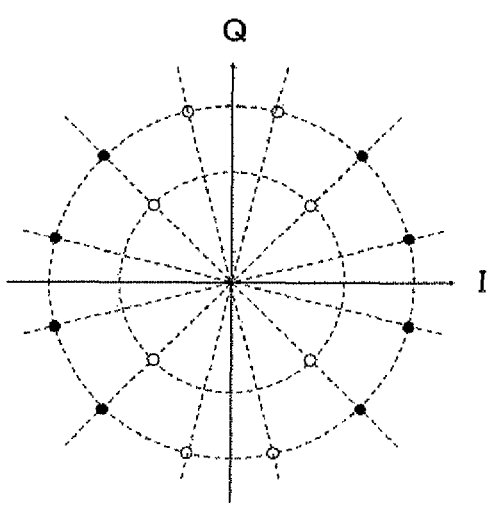
Figure 44:
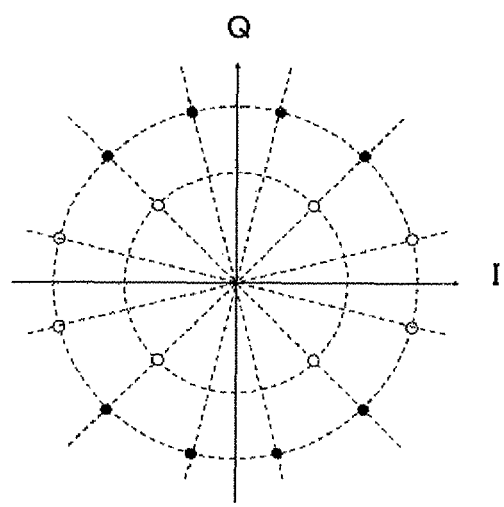
Figure 45:
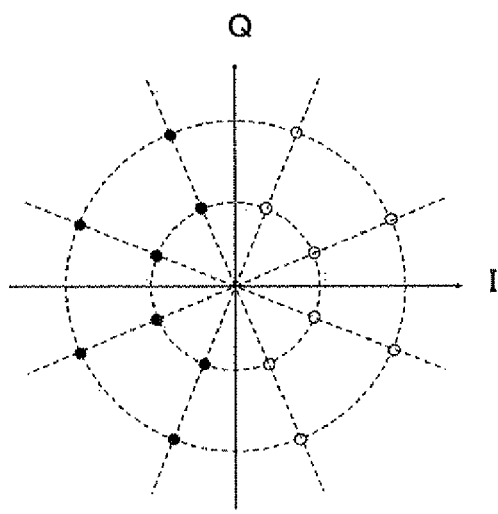
FIG. 45 is a diagram illustrating a symbol arrangement for describing a bit allocation (mapping) under (8, 8) star 16QAM.
Figure 45:
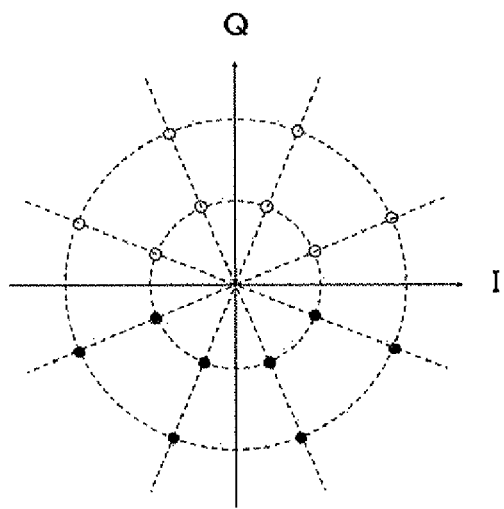
Figure 45:
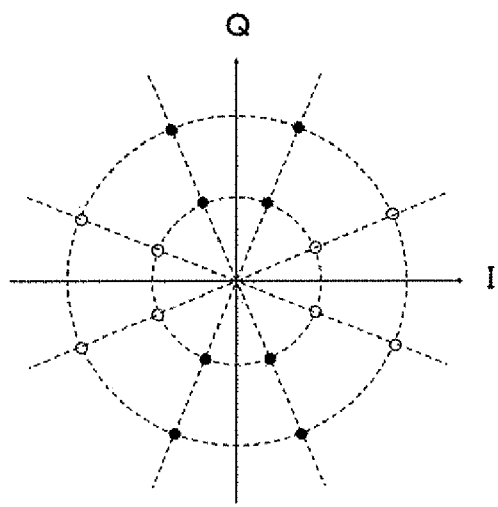
Figure 45:
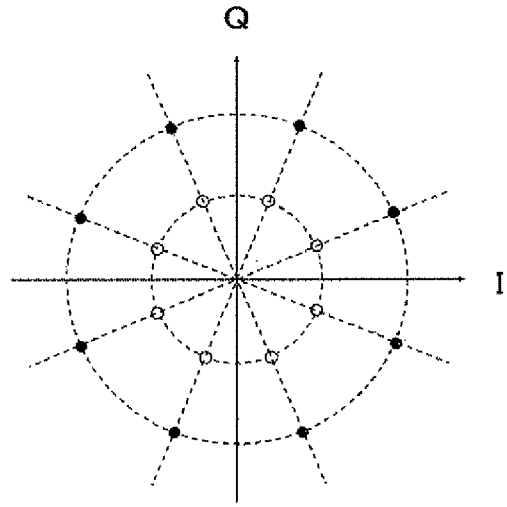
Figure 46:
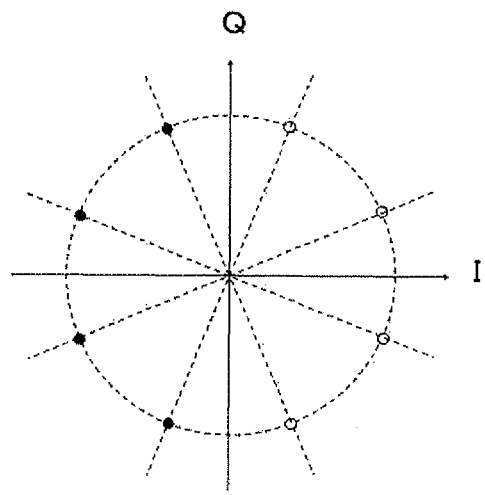
FIG. 46 is a diagram illustrating a symbol arrangement for describing a bit allocation (mapping) under 8PSK.
Figure 46:
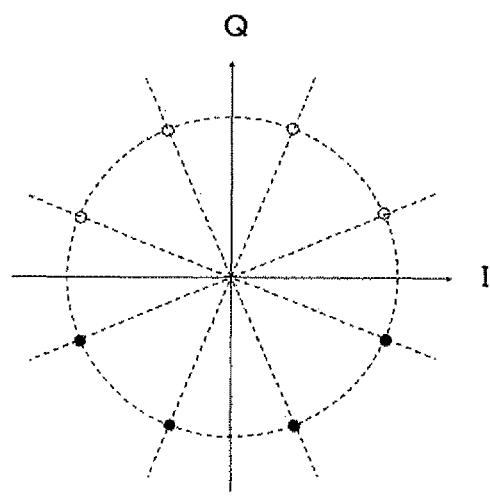
Figure 46:
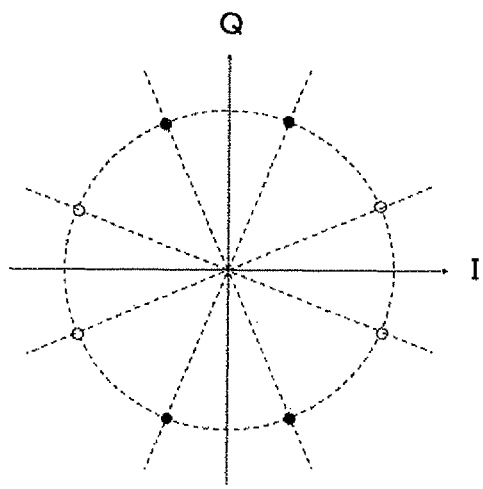
Figure 47:
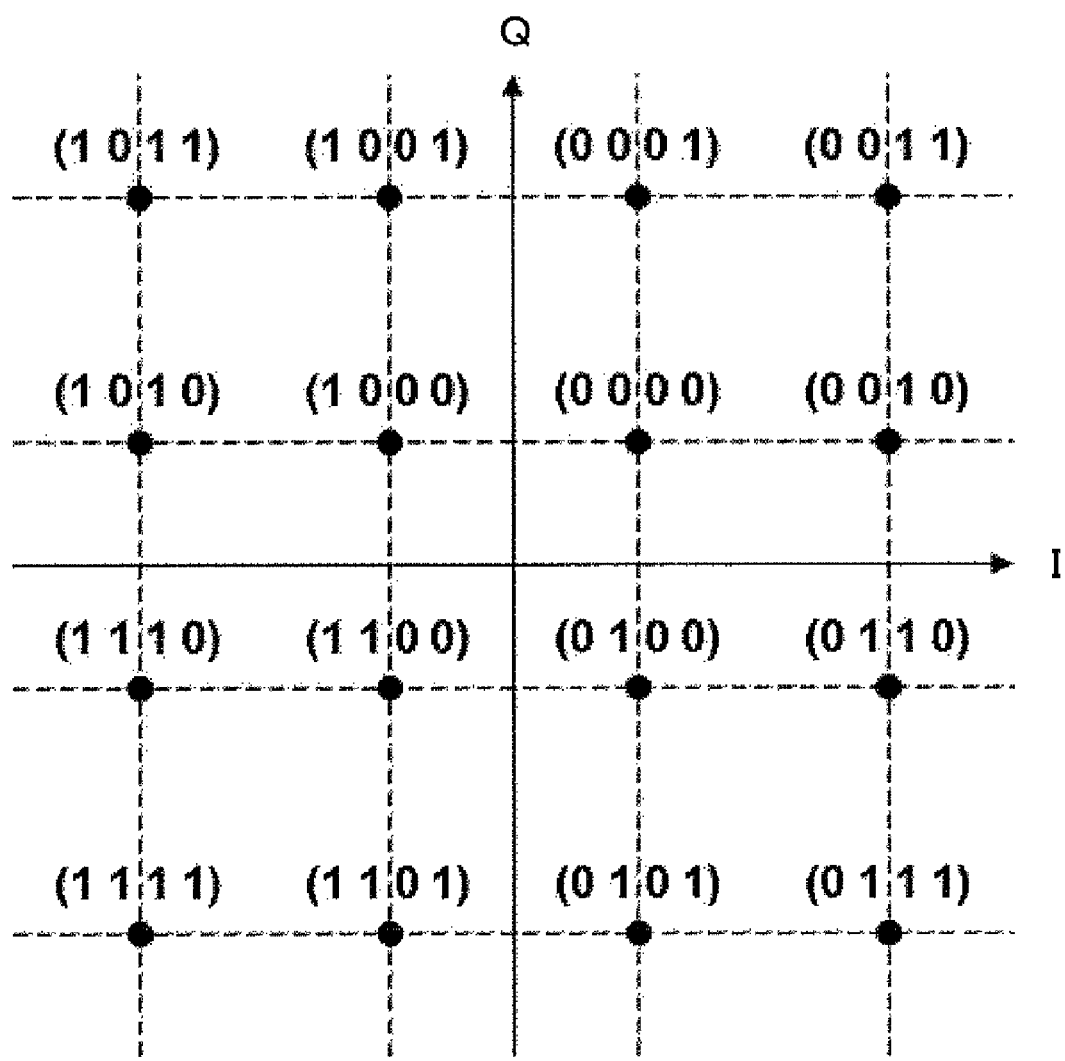
FIG. 47 is a diagram illustrating a symbol arrangement for describing gray mapping under grid-like 16QAM.

Then, with attention paid to important parts thereof, the transmitter 1 includes, for example: a coding ratio/modulation scheme determiner 11; a turbo coder 12; a rate matcher 13; a bit corrector 14; a modulator 15; an amplifier (AMP) 16; a transmitter antenna 17; and a controller 18. The receiver 2 includes, for example: a receiver antenna 21; a demodulator 22; a coding ratio/modulation scheme determiner 23; a demodulator 24; a bit corrector 25; a rate matcher 26; and a turbo decoder 27. In this instance, the turbo coder described above with reference to FIG. 40 can be used as the turbo coder 12 of the transmitter 1, and the turbo coder described above with reference to FIG. 41 can be used as the turbo decoder 27 in the receiver 2.

Here, in the transmitter 1, the coding ratio/modulation scheme determiner (transmission parameter determining unit) 11 determines transmission parameters including a coding ratio used by the turbo coder 12 and a modulation scheme used by the modulator 15 in accordance with control information from the controller 18. The turbo coder (coding means) 12 performs turbo coding of transmission data in accordance with the coding ratio determined by the coding ratio/modulation scheme determiner 11. For example, the above turbo coder is operable to obtain a systematic bit (S) and two types of parity bits (P1 and P2). In this instance, a ration of generation of such a systematic bit (S) and parity bits (P1 and P2) basically depend on not only the above coding ratio but also puncturing processing performed by the rate matcher 13 described below.

The rate matcher 13 performs bit repetition processing or puncturing (thinning-out) processing to a bit series coded by the turbo coder 12, thereby executing rate matching, in which the above bit series are made to agree to the number of bits of a predetermined channel of a radio link.

The bit corrector (bit correction means) 14, as described above, performs bit correction in such a manner that systematic bits (S) are allocated with high priority to the first bit and the second bit with the high likelihood (quality) thereof in a single symbol, in a case of default setting (mode) with respect to the bit series after being subjected to the rate matching. Here, as described later, there also is a mode (inverse mode) in which parity bits (P1 and P2) are allocated with high priority to the first and the second bit with the high likelihood thereof. The modulator (multi-level modulating means) 15 modulates (maps to a symbol) the above mentioned bit series with a modulation scheme determined by the coding ratio/modulation scheme determiner 11. Here, in a case of QPSK, the above mentioned bit correction is not performed (basically, performed in a case where 16QAM is selected in adaptive modulation). The amplifier 16 amplifies the modulated data [an analogue radio signal obtained by a non-illustrated digital to analogue converter and a non-illustrated frequency converter (up-converter), or the like] obtained by the modulator 15 up to a required transmission signal level. The transmitter antenna 17 transmits the amplified transmission signal to a propagation path.

Then, the controller (symbol arrangement controlling means) 18 controls the coding ratio/modulation scheme determiner 11, the bit corrector 14, and the modulator 15. According to the present embodiment, the controller 18 gives information (control information) which works as an element for determining a coding ratio and a modulation scheme to the coding ratio/modulation scheme determiner 11, and also has the following functions.

That is, the controller 18 controls bit correction processing performed by the bit corrector 14 in accordance with a ratio (distribution ratio) of systematic bits (S) to parity bits (P1 and P2) (mainly depends on the above mentioned coding ratio), to control the method of allocation of parity bits. Further, the controller 18 controls mapping processing by the modulator 15 in accordance with the coding ratio, so as to perform change (symbol arrangement control) of the positions of symbols arranged at equal intervals on the complex plane (IQ plane) to different positions by a predetermined amount by the unit of a symbol. Furthermore, the controller 18 is capable of giving bit correction control information corresponding to the coding ratio and the symbol control amount information (amplitude and phase) to the bit corrector 14 and the modulator 15, respectively. In this instance, a detailed description of bit correction control and symbol arrangement control will be made later. In addition, control information to the receiver 2 can contain the bit correction control information and the symbol control amount information, such information thereby being able to be notified to the receiver 2.

For example, according to HSDPA (High-Speed Downlink Packet Access) specification of 3GPP (3rd Generation Partnership Project), signaling is executed to the receiver 2 through a control channel before packet transmission, a coding ratio adaptively selected on the transmitter 1 end and information (transmission parameters) relating to a modulation scheme being thereby notified from the transmitter end to the receiver end. This makes possible notification of the control information.

That is, in a case of HSDPA, since information relating to data to be transmitted on an HS-PDSCH (High Speed-Physical Downlink Shared Channel) is notified from the transmitter end to the receiver end beforehand on an HS-SCCH (High Speed-Shared Control Channel), if information bringing about change in the symbol arrangement and the bit correction method is transmitted from the transmitter 1 to the receiver 2 with a signaling packet, as in the case of information of the modulation scheme, etc., the receiver 2 is capable of recognizing such changes and performing demodulation and decoding processing in accordance with the thus recognized changes.

On the other hand, in the receiver 2, the receiver antenna 21 receives a radio signal from the above mentioned transmitter 1. The demodulator 22 demodulates control information, out of signals received by the receiver antenna 21, with the demodulation scheme corresponding to the modulation scheme used by the transmitter 1. That is, the demodulator 22 functions as a symbol arrangement information receiving means which receives from the transmitter 1 information relating to the symbol arrangement changed on the transmitter end. In this instance, illustration of a frequency converter (down converter), which performs frequency conversion of a reception signal into a base band signal, and of a digital to analogue converter, which converts an analogue signal into a digital signal, or the like, are omitted.

The coding ratio/modulation scheme determiner (transmission parameter determining unit) 23 identifies information (transmission parameters) relating to the coding ratio and the modulation scheme on the transmitter 1, based on the control information demodulated by the demodulator 22, and notifies the identified information to the demodulator 24. In the present example, it is possible for the coding ratio/modulation scheme determiner 23 to notify the demodulator 24 also of the above described symbol control amount information together.

On the basis of the information notified from the coding ratio/modulation scheme determiner 23, the demodulator (demodulating means) 24 demodulates data (user data) other than the above control information, out of a reception signal, with the demodulation scheme corresponding to the modulation scheme used on the transmitter 1 in consideration of (based on) the symbol control amount information (information relating to symbol arrangement).

The bit corrector 25 performs procedures (bit correction) inverse to the bit correction performed by the bit corrector 14 on the transmitter 1 end to the data demodulated by the demodulator 24, thereby restoring the data corresponding to the demodulation data before being subjected to bit correction on the transmitter 1. Likewise, the rate matcher 26 performs processing (puncturing or bit repetition) inverse of that which is performed by the rate matcher 13 on the transmitter 1 end, thereby obtaining a bit series corresponding to that before being subjected to rate matching on the transmitter 1.

The turbo decoder (decoding means) 27 performs turbo decoding processing to a bit series after rate matching thereof, to decode the original transmission data (information series).

In the system of the present embodiment with the construction described above, the transmission data is turbo coded (coding process) by the turbo coder 12 at a coding ratio determined by the coding ratio/modulation scheme determiner 11, and the coded transmission data is then subjected to rate matching processing and bit correction processing by the rate matcher 13 and the bit corrector 14, respectively (bit correction process). After that, the transmission data is subjected to modulation processing (mapping processing to symbols) performed by the modulator 15 with a modulation scheme (for, example, 16QAM) determined by the coding ratio/modulation scheme determiner 11 (multi-level modulating process).

At that time, the controller 18 controls mapping processing in accordance with a ratio of systematic bits (S) to parity bits (P1 and P2) so that the positions of symbols on the IQ plane which are allocated at equal intervals are controlled to be changed by a predetermined amount from the original positions thereof (symbol arrangement control process). In this instance, information (that is, relating to symbol arrangement) relating to such an amount of change (amplitude and phase) is contained in the above mentioned control information (for example, a signaling packet on the HS-SCCH) and is notified to the receiver 2 beforehand.

The modulation data obtained by the modulator 15 is converted into an analogue signal, and is then amplified up to a required transmission signal level by the amplifier 16. After that, the amplified analogue signal is transmitted to a propagation path through the transmitter antenna 17.

On the other hand, in the turbo coder 12, the receiver antenna 21 receives the radio signal transmitted from the transmitter 1, and the demodulator 22 demodulates the control information contained in the received signal. On the basis of the control information, the coding ratio/modulation scheme determiner 23 identifies the coding ratio and the modulation scheme used in the transmitter 1. The information relating to the modulation scheme and the information relating to the coding ratio are notified to the demodulator 24 and to the turbo decoder 27, respectively. In this instance, if the control information contains symbol control amount information, such information is notified also to the demodulator 24.

On the other hand, user data, out of the reception signal, is demodulated by the demodulator 24 with the demodulation scheme corresponding to the modulation scheme used by the transmitter 1 based on the information (information relating to the modulation scheme and symbol control amount information) notified from the coding ratio/modulation scheme determiner 23 (demodulation process). After being subjected to bit correction processing performed by the bit corrector 25 and rate matching processing performed by the rate matcher 26, the user data is turbo decoded by the turbo decoder 27. As a result, the information series transmitted by the transmitter 1 is obtained (decoding process).

Next, a detailed description will be made hereinafter of bit correction control and symbol arrangement control performed by the controller 18, which are main points of the present embodiment. In this instance, in the following description, the directions of control of symbols should by no means be always limited to a circular one, a horizontal one, or a vertical one. The control can be performed in a direction such that the likelihood of the bits in a single symbol, a required likelihood thereof is expected to be obtained corresponding to a coding ratio, becomes large.

(2.1) First Aspect (in a Case of Enlarging the Likelihood Only of the First Bit):

For example, as shown in FIG. 3, in a case where the coding ratio is smaller than 1/4 and where systematic bit (S1 through S4 are allocated only to the leading bit (first bit) (see the shaded part), the likelihood only of the first bit to which the systematic bits (S1 through S4) are allocated is enlarged. In this case, to change the bit correction method used by the bit corrector 14 in addition to changing the symbol arrangement involves better optimization.

That is, as indicated by the dotted arrow of FIG. 3, parity bits (P1-1 through P1-12, and P2-1 through P2-12; hereinafter will be referred to as P1, P2 unless any distinction there among is made) are spread (allocated) over in the horizontal direction of the paper, so that the parity bits P1 and the parity bits P2 are equally distributed for each bit. The change of the bit correction method in this manner exhibits greater improvement effects with the smaller number of systematic bits (S) [in the previous bit correction, the smaller the number of systematic bits (S), the greater the deflection between parity bits (hereinafter, also simply called "parities") P1 and parity bits P2 in each bit].

Supposing that bit correction processing is performed with the present bit correction method at a coding ratio=1/18, the result shown in FIG. 4 is obtained. That is, the distribution of parities P1 and P2 to each bit in a single symbol becomes that which is shown in the following table 1.

TABLE 1

Parity Distribution with Bit Correction in the
Vertical Direction (Coding Ratio = 1/18)

| Bit Position in 1 Symbol | The Number of Parities P1 | The Number of Parities P2 |
|---|---|---|
| First Bit | 0 | 7 |
| Second Bit | 8 | 1 |
| Third Bit | 1 | 8 |
| Fourth Bit | 8 | 1 |

In this manner, even when the coding ratio is smaller than 1/4, in a case of the coding ratio is particularly small, the previous bit correction method raises an issue of a large deflection in the distribution of parities P1 and parities P2.

In contrast, in a case where the bit correction method is changed (parities P1 and parities P2 are spread over in the horizontal direction), the result shown in FIG. 5 is obtained. That is, the distribution of parities P1 and parities P2 to each bit in a single symbol becomes that which is shown in the following table 2.

TABLE 2

Parity Distribution with Bit Correction in the
Horizontal Direction (Coding Ratio = 1/18)

| Bit Position in 1 Symbol | The Number of Parities P1 | The Number of Parities P2 |
|---|---|---|
| First Bit | 3 | 4 |
| Second Bit | 5 | 4 |
| Third Bit | 4 | 5 |
| Fourth Bit | 5 | 4 |

In this manner, it is understandable that the distribution of parities P1 and parities P2 of each bit becomes closer to being averaged by means of allocating parities P1 and P2 in the horizontal direction. As a result, it can be expected that the effect of improvement of an error rate in the receiver 2 be increased more in comparison with the previous method. In this instance, hereinafter, bit correction with the previous method will be called "bit correction in the vertical direction"; bit correction in the present example will be called "bit correction in the horizontal direction".

After such bit correction in the horizontal direction being performed by the bit corrector 14, the controller 18 controls the modulator 15 to control symbols in a direction such that the likelihood of the leading bit (first bit) to which systematic bit (S) has been allocated becomes larger.

Figure 6:
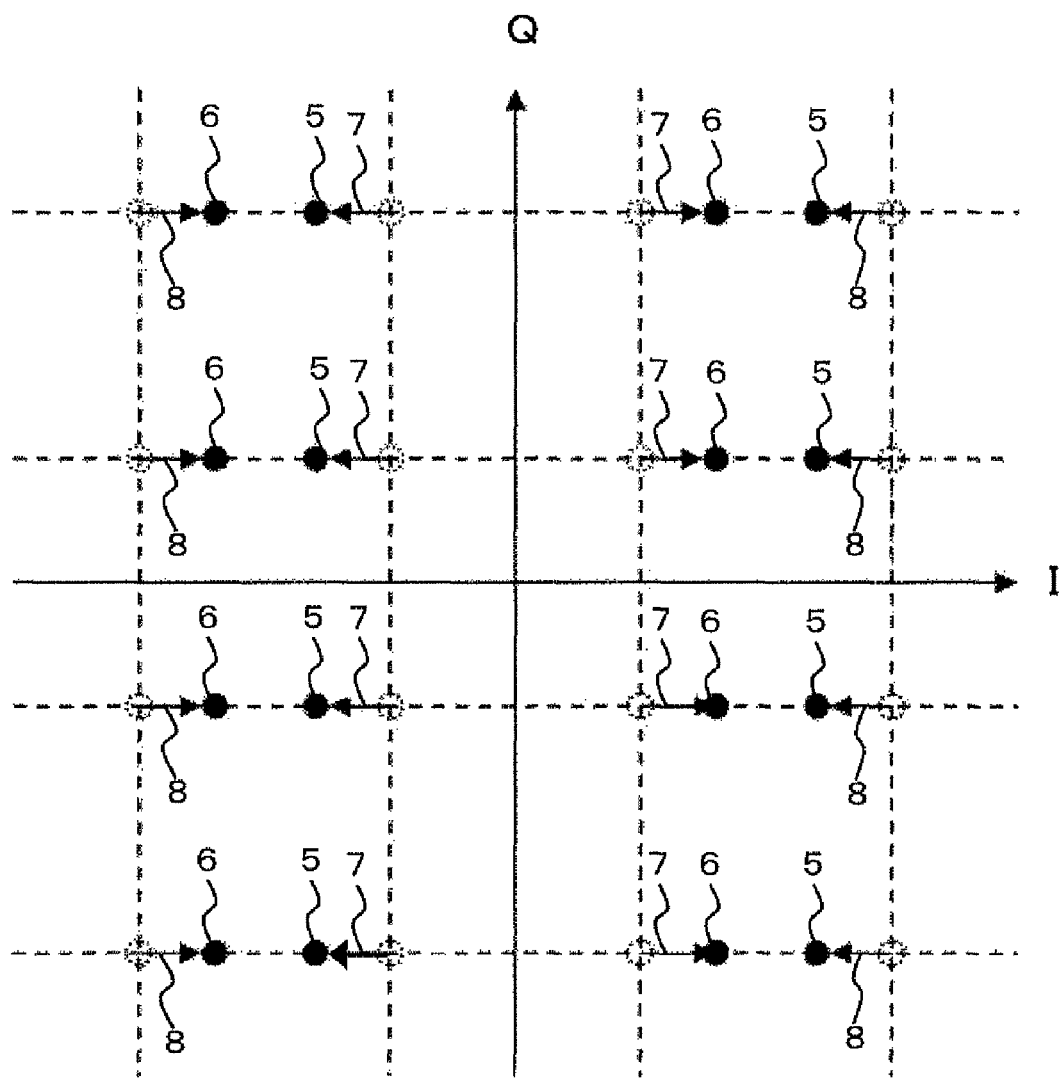
FIG. 6 is a symbol arrangement diagram for describing symbol arrangement control (when the likelihood of a first bit is made to be large) in a case of grid-like 16QAM in the first aspect of the first embodiment.

(2.1.1) In a Case of Grid-Like 16QAM:

In this case, as shown in FIG. 6, for example, the controller 18 performs control in such a manner that the positions of eight symbols (see the reference character 5) the closest to the imaginary axis (Q axis) are moved in a direction so as to separate from each other with respect to the Q axis (it means that the amplitude and the phase of the symbols are changed; the same goes for the following description) (see the arrow 7) on the IQ plane. Here, in a case where the power (transmission power; the same goes for the following description) should maintain a fixed level (that is, making the power equal before and after change of symbol arrangement; the same goes for the following description), the eight symbols (see the reference character 6) are controlled inwardly (in the direction in which the symbols approach the imaginary axis (see the arrow 8).

The use of such symbol control enlarges the likelihood of the first bit, which indicates a quadrant decision with respect to the Q axis, and diminishes the third bit, which indicates a distance evaluation from the Q axis, because of increase in symbol density. With the symbols being controlled in such a manner, the likelihood of the first bit becomes larger, so that an error rate of the whole is generally improved, but the improvement of characteristic stops upon control made to a certain amount. In addition, since further control of the symbols makes the likelihood of the third bit too small, the characteristics of an error rate of the whole is deteriorated. In this instance, the likelihood of the second and the fourth bit is not changed.

Further, symbol control such that the power becomes equal before and after change of the symbol arrangement as described above, moderates increase in the load due to increase in the average transmission power in the transmitter 1 accompanying the symbol arrangement change, for example, PAPR, thereby realizing a lessening of amplification characteristic necessary for the amplifier 16. In this instance, this matter goes for in a case where symbol arrangement control is performed so as to make the power keep a fixed level in the various modifications described hereinafter. The relationship between the present invention and PAPR will be described later.

Figure 7:
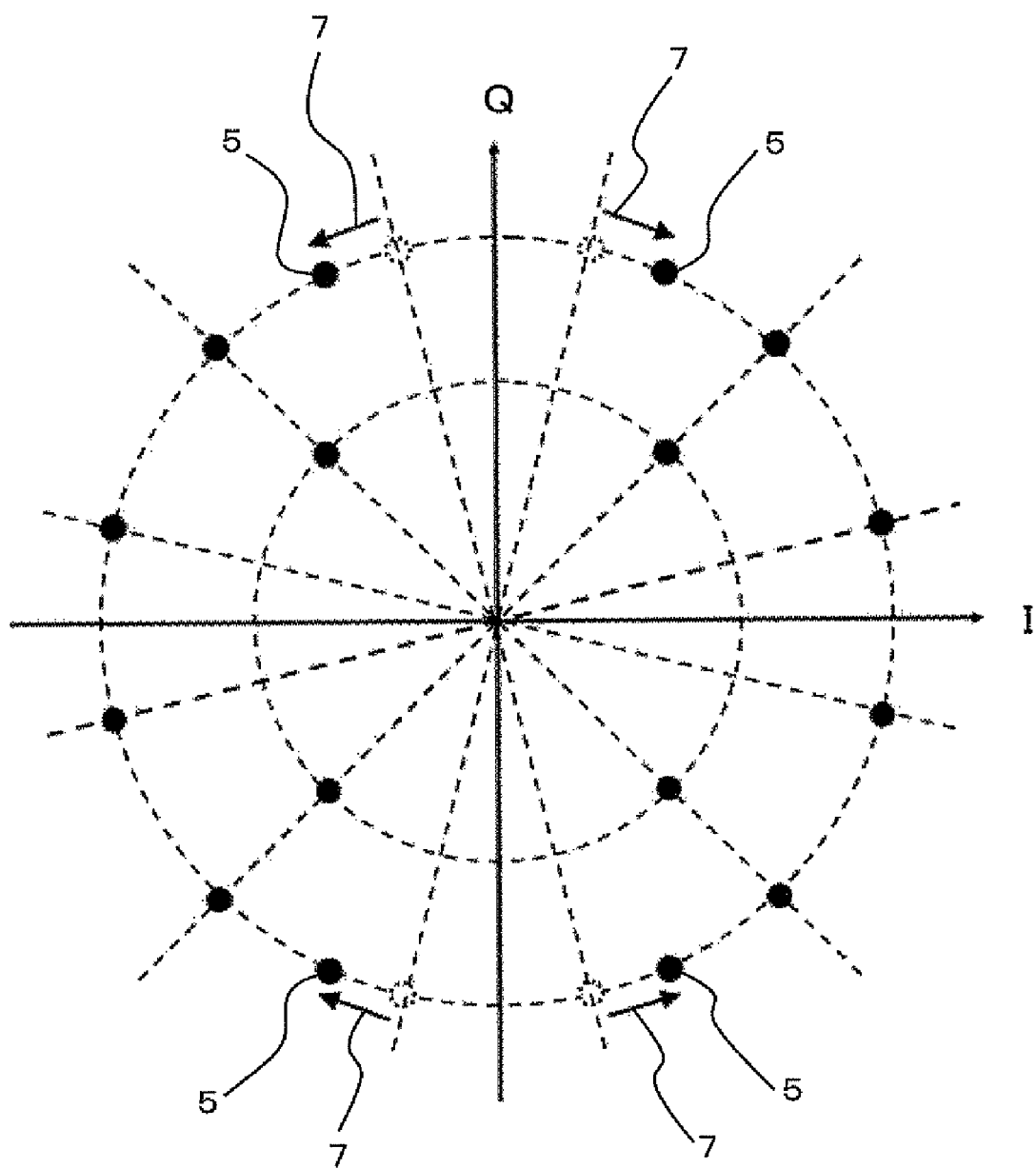
FIG. 7 is a symbol arrangement diagram for describing symbol arrangement control (when the likelihood of a first bit is made to be large) in a case of (4, 12) circular 16QAM in the first aspect of the first embodiment.

(2.1.2) In a Case of (4, 12) Circular 16QAM:

In this case, as shown in FIG. 7, for example, the controller 18 performs control in such a manner that the positions of four symbols (see the reference character 5) the closest to the imaginary axis (Q axis) are controlled in a direction so as to separate from each other with respect to the Q axis. At that time, in a case where the power maintains a fixed level, the symbols to be controlled are controlled along the same circle (see the arrow 7).

In this instance, the optimal control amount depends on a radius ratio of the inner circle to the outer circle. That is, in (4, 12) circular 16QAM and (8, 8) star 16QAM, which are circular modulation schemes, the radius ratio of the inner circle to the outer circle exhibits effects to characteristics as parameters. Then, when turbo codes are used, the optimal radius ratio relates to the coding ratio. That is, at the time a certain coding ratio is given (depending on the condition of a propagation path), a single optimal radius ratio is obtained. For example, the smaller the coding ratio (the fewer the systematic bits), the smaller the optimal radius ratio. In contrary, the larger the coding ratio (the more the systematic bits), the larger the optimal radius ratio. That is because of the following reason.

A small coding ratio means that the number of systematic bits is small. In this case, adjustment of the radius ratio such that the likelihood of systematic bits becomes strong provides the optimal characteristic. Since the systematic bits are sequentially allocated beginning from the first bit, in consideration of determining the radius ratio such that the likelihood of the first bit is strong, the small radius ratio (the radius of the inner circle and that of the outer circle becomes close) becomes the optimal.

As a result of diminishing the radius ratio in such a manner, the likelihood of the third and the fourth bit becomes small in a case of (4, 12) circular 16QAM, and the likelihood of the fourth bit becomes small in a case of (8, 8) star 16QAM, and bits allocated to such bits are parity bits. When the coding ratio is small, the optimal characteristic can be obtained by means of enlarging the likelihood of systematic bits few in number even with parity bits large in number being sacrificed.

With the coding ratio enlarged, the optimal characteristic can contrarily be obtained by means of enlarging the likelihood of parity bits. That is, the optical radius becomes large. Here, since enlarging of the coding ratio means becoming close to a case in which coding is not performed, the radius ratio eventually becomes close to a radius ratio which is optimal in a case where coding is not executed (equals to a radius ratio optimal for the Raw BER (Bit Error Rate) characteristic, and the condition in which all of the 16 symbols are arranged at intervals as equal as possible.

Further, an idea of the embodiment is to improve characteristics by means of arranging symbols at positions different from those of the previous art. The optimal value of this control amount (d in a case where the symbols are moved along circles) has a relationship with a radius ratio. That is, the smaller the radius ratio of the inner circle to the outer circle, the larger the optimal control amount; in contrary, the larger the radius ratio of the inner circle to the outer circle, the smaller the optimal control amount.

With what is described the above, a relationship between the coding ratio and the optimal control amount is considerable. That is, the smaller the coding ratio, the smaller becomes the optimal radius ratio, so that the optimal control amount becomes large. Contrarily, the larger the coding ratio, the larger becomes the optimal radius, so that the optimal control amount becomes small.

Hence, the optimal radius ratio and the optimal control amount depend on the amount of systematic bits. This matter goes for the following description unless any particular description is made.

Figure 8:
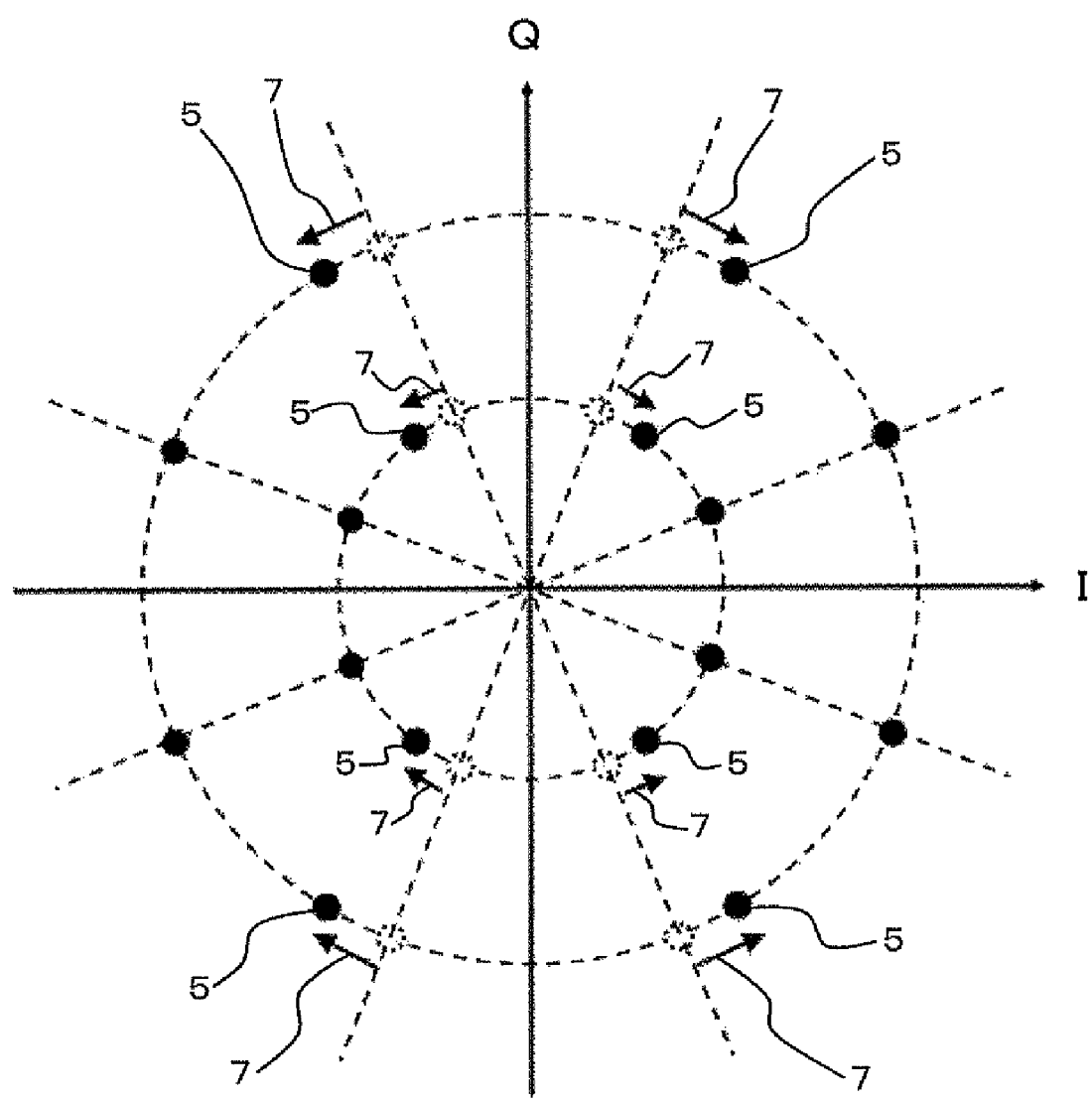
FIG. 8 is a symbol arrangement diagram for describing symbol arrangement control (when the likelihood of a first bit is set to be large) in a case of (8, 8) star 16QAM in the first aspect of the first embodiment.

(2.1.3) In a Case of (8, 8) Star 16QAM:

In this case, as shown in FIG. 8, for example, the controller 18 performs control in such a manner that the positions of eight symbols (see the reference character 5) the closest to the imaginary axis (Q axis) are moved in a direction so as to separate from each other (from the Q axis). At that time, in a case where the electric power should maintain a fixed level, the symbols to be moved are moved along the same circle (see the arrow 7). In this instance, in this case, also, the optimal control amount depends on a radius ratio of the inner circle to the outer circle.

Figure 19:
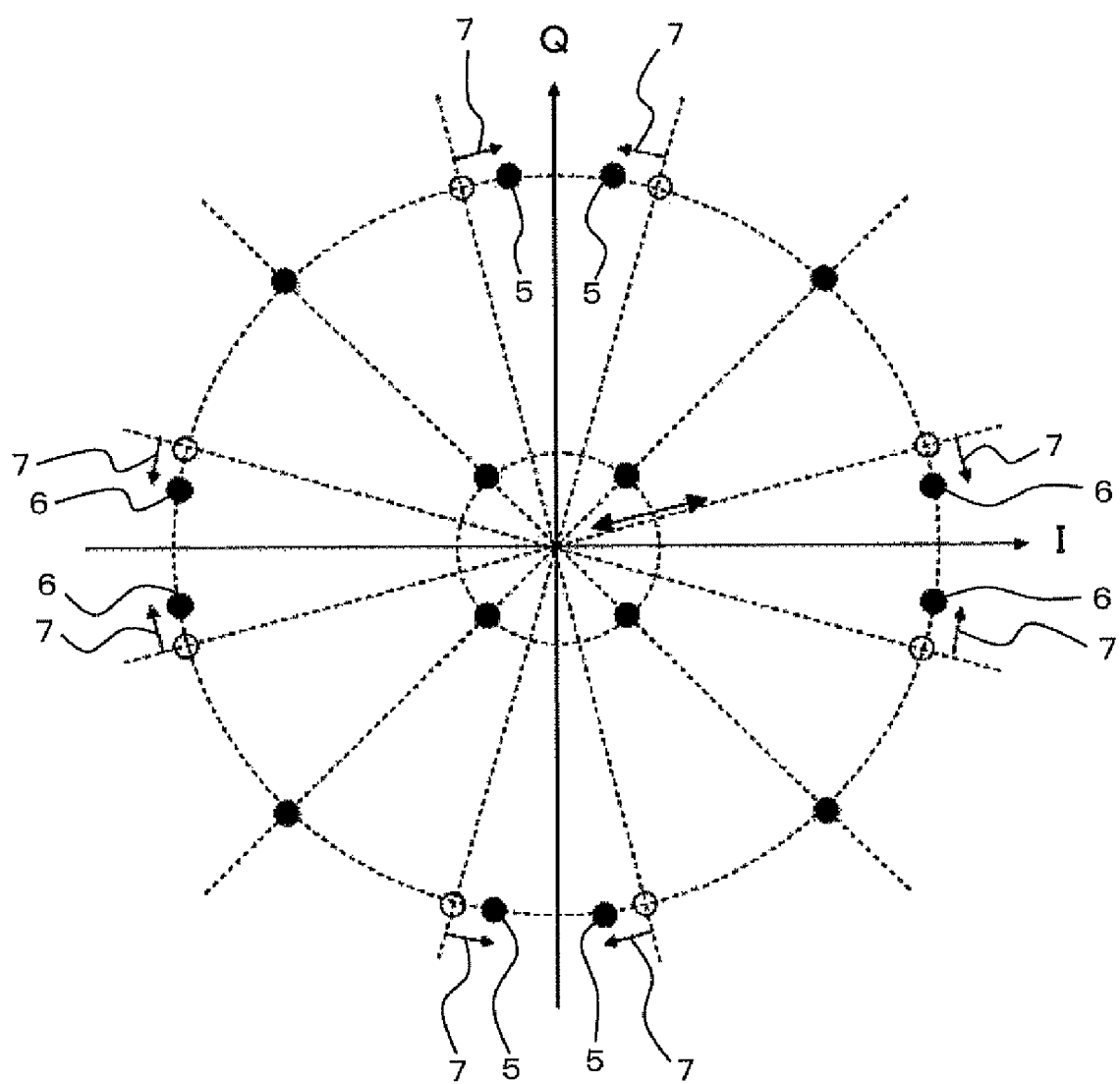
FIG. 19 is a symbol arrangement diagram for describing symbol arrangement control (when the likelihood of a third and a fourth bit is made to be large) in a case of (4, 12) circular 16QAM in the third aspect of the first embodiment.

(2.2) Second Aspect (In a Case Where the Likelihood of the First and the Second Bit is Enlarged):

For example, as shown in FIG. 19, when systematic bits (S1 through S12) are allocated (see the shaded part) to the first bit and the second bit in bit correction processing at a coding ratio not smaller than 1/4 and not larger than 1/2, the likelihood of the first bit and the second bit to which the systematic bits (S1 through S12) are allocated is enlarged.

In this case, the controller 18 changes the bit correction method used by the bit corrector 14 into bit correction in the horizontal direction only in a case of (8, 8) star 16QAM. In this instance, since change of the bit correction method in the horizontal direction does not cause a significant difference in the distribution of parities P1 and P2 (characteristic is not changed) in grid-like 16QAM and (4, 12) circular 16QAM, the previous bit correction in the vertical direction is available as shown in FIG. 19.

Figure 10:
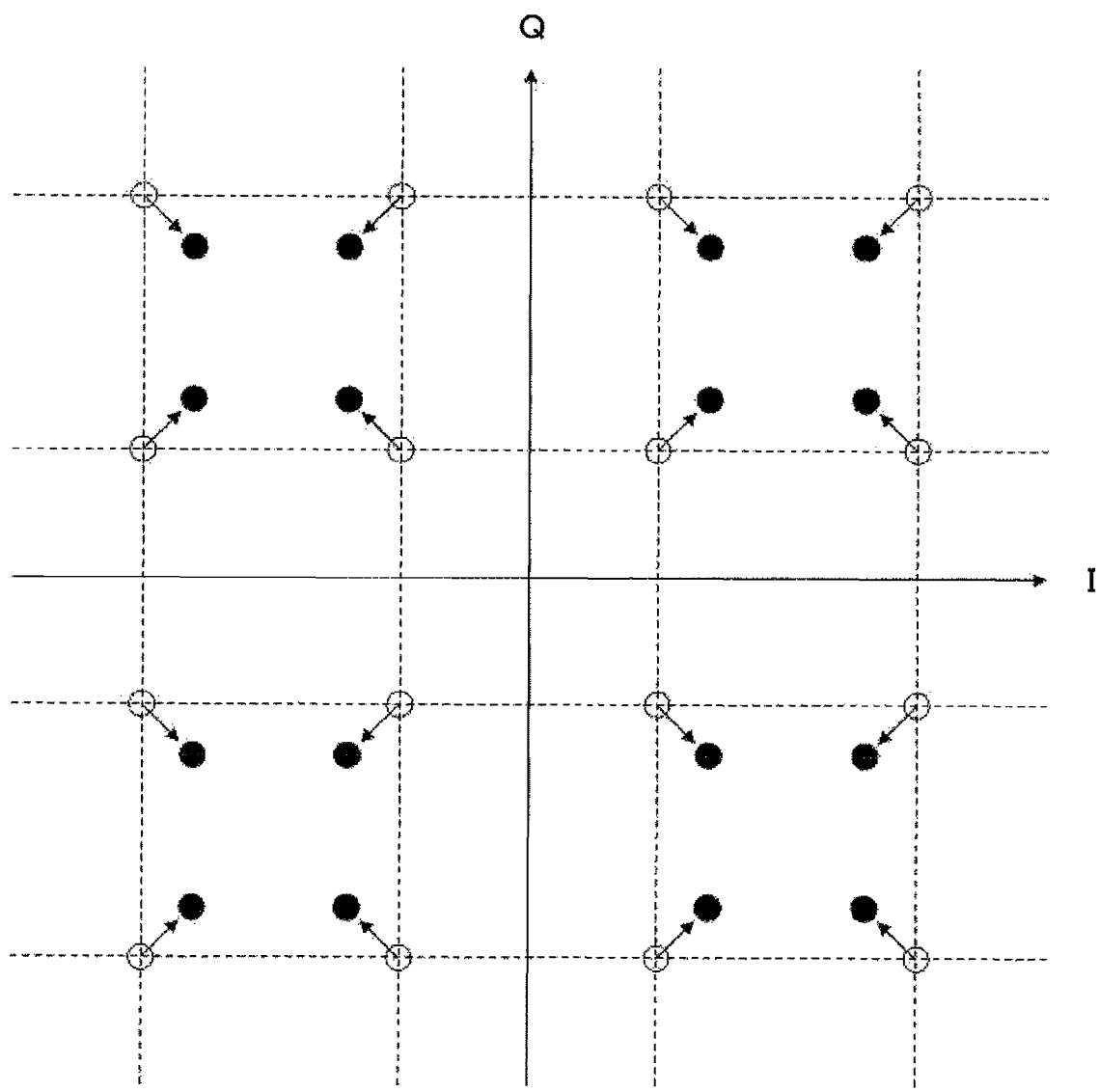
FIG. 10 is a symbol arrangement diagram for describing symbol arrangement control (when the likelihood of a first and a second bit is made to be large) in a case of grid-like 16 QAM in the second aspect of the first embodiment.

(2.2.1) In a Case of Grid-Like 16QAM:

In this case, as shown in FIG. 10, for example, the controller 18 performs symbol control to all the 16 symbols. That is, since inner (close to the I axis and the Q axis) the symbols relating to systematic bits (S) are controlled outwardly (in a direction in which the symbols separates from the I axis and the Q axis), the outer symbols are controlled in the inner direction (in a direction in which symbols approach the I axis and the Q axis). This makes the likelihood of the first bit and the second bit, which are used quadrant decision with respect to the I axis or the Q axis, large (the likelihood of the third bit and the fourth bit, which are used distance evaluation from the I axis or the Q axis, becomes small because of high symbol density).

In this manner, with the symbols being controlled, an error rate of the whole is generally improved up to a certain level because of the effect of enlarging of the likelihood of systematic bit (S). However, further symbol movement deteriorates characteristic because the likelihood of the third bit and the fourth bit becomes too small.

Figure 11:
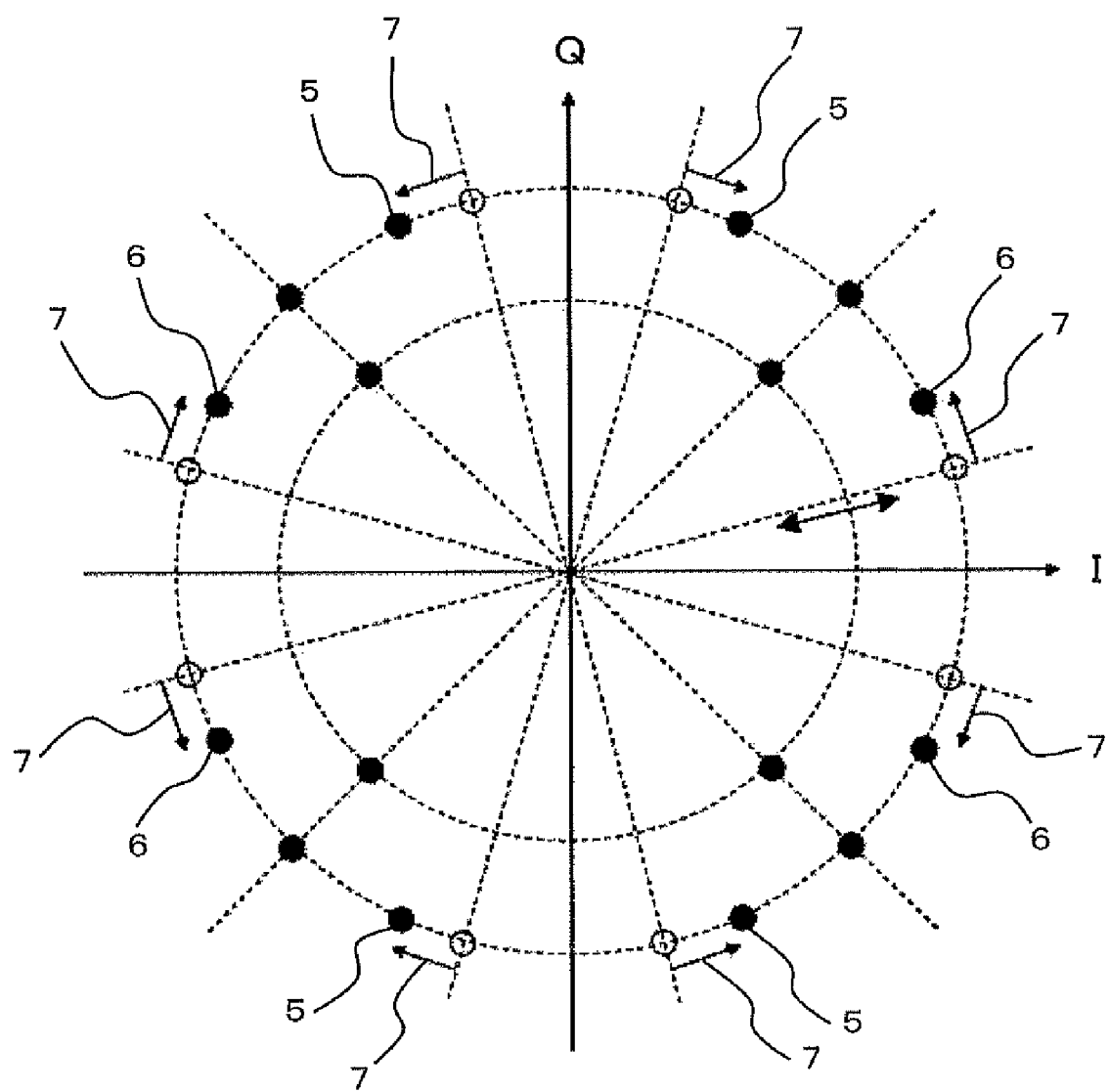
FIG. 11 is a symbol arrangement diagram for describing symbol arrangement control (when the likelihood of a first bit and a second bit is made to be large) in a case of (4, 12) circular 16 QAM in the second aspect of the first embodiment.

(2.2.2) In a Case of (4, 12) Circular 16QAM:

In this case, as shown in FIG. 11, for example, the controller 18 performs symbol control to a total of eight symbols, four symbols (see the reference character 6) close to the real axis (I axis) on the outer circle and four symbols (see the reference character 5) close to the imaginary axis (Q axis). At that time, if the power is made to be fixed, the symbols to be controlled are controlled along the same circle (see arrow 7).

This enlarges the likelihood of the first bit and the second bit, which are used quadrant decision with respect to the I axis and the Q axis (the likelihood of the third bit and the fourth bit, which is distance evaluation from the I axis and the Q axis becomes small).

In this case, also, with the symbols being controlled, an error rate of the whole is generally improved up to a certain level because of the effect of enlarging of the likelihood of systematic bit (S). However, further symbol control will contrarily deteriorate characteristic because the likelihood of the third bit and the fourth bit becomes too small. In this instance, the optimal control amount depends on a diameter ratio of the inner circle to the outer circle. For example, when the coding ratio=1/3, the optimal radius ratio of the inner circle to the outer circle is 1:1.9. Here, change in the coding ratio causes a change of the optimal radius ratio [that is, the optimal θ (an angle with which the symbols are controlled along the circles)].

Figure 12:
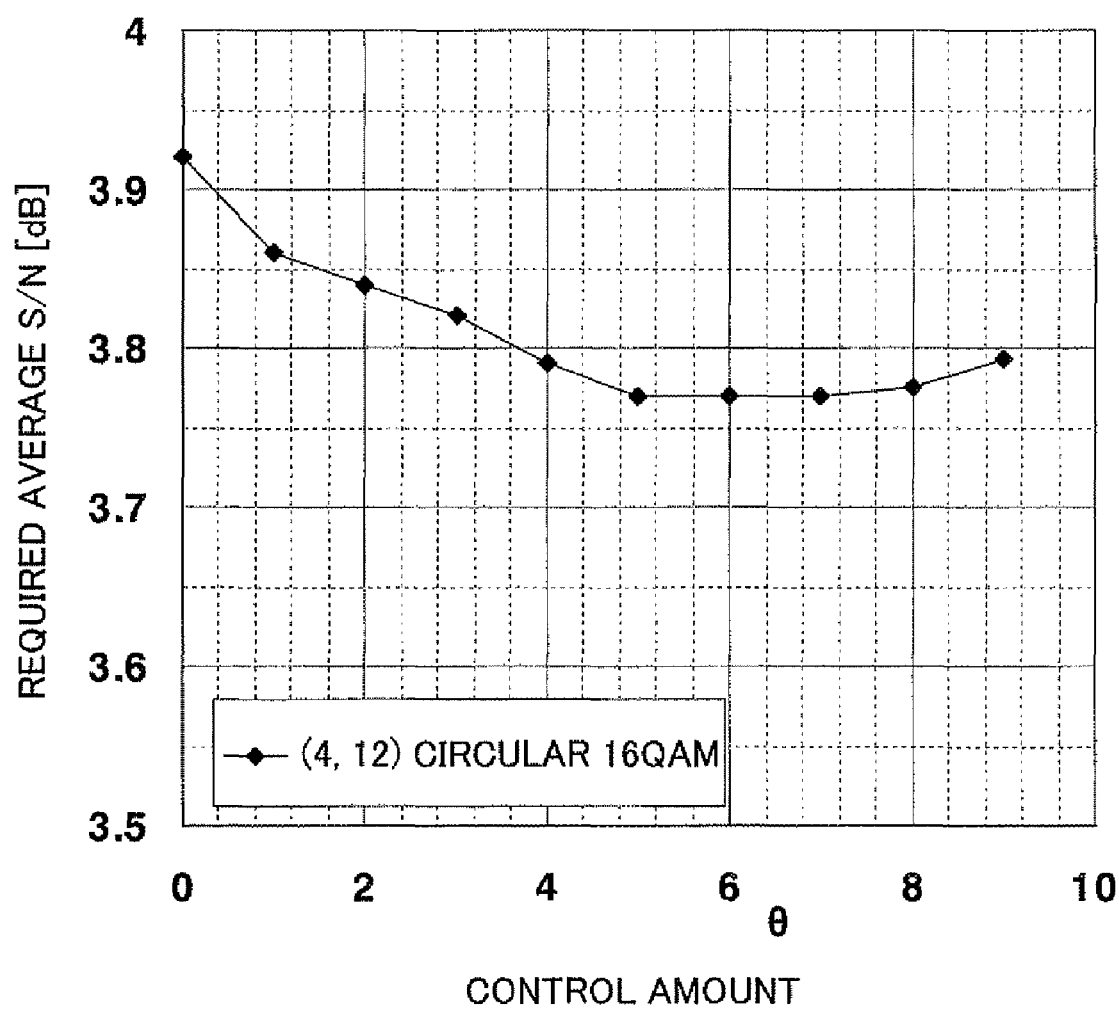
FIG. 12 is a graph indicating an example of a simulation result [an average S/N characteristic (@BLER=0.1) with respect to the symbol control amount] as a result of symbol arrangement control shown in FIG. 11.

FIG. 12 shows a graph indicating a required average S/N characteristic which satisfies BLER=0.1 with respect to θ in a case where the symbols are controlled by an angle of θ along the circle as shown in FIG. 11. From this FIG. 12, it is understandable that an improvement of about 0.2 dB (θ=6°) at the maximum can be obtained in comparison with a case where the symbols are not controlled (θ=0°) (that is, an equal interval arrangement).

In this manner, to set the optimal symbol control amount enhances the effect of bit correction processing, so that characteristics after decoding performed is improved as a whole.

(2.2.3) In a Case of (8, 8) Star 16QAM:

In this case, the controller 18 is capable of performing an improved optimization by means of changing the bit correction method used by the bit corrector 14 also, in addition to changing the symbol arrangement as in the case of the first modification. Here, in a case of (8, 8) star 16QAM, since the likelihood of the third bit differs from that of the fourth bit, parities P1 and parities P2 are equally allocated to the third bit, and similarly, parities P1 and parities P2 are equally allocated to the fourth bit. In the grid-like 16QAM and (4, 12) circular 16QAM, the likelihood of the third bit equals to that of the fourth bit, so that the number of parities P1 and the number of parities P2 should be equal in the sum of the third bit and the fourth bit. Thus, as to the grid-like 16QAM and the (4, 12) circular 16QAM, the vertical bit correction method is available.

Provisionally, if the vertical bit correction method is performed, the result becomes that which is shown in FIG. 13. That is, the distribution of parities P1 and P2 to each bit in a single symbol becomes what is shown in the following table 3.

TABLE 3

Parity Distribution with Bit Correction in the Vertical Direction

| Bit Position in 1 Symbol | The Number of Parities P1 | The Number of Parities P2 |
|---|---|---|
| Second Bit | 3 | 3 |
| Third Bit | 3 | 6 |
| Fourth Bit | 6 | 3 |

As indicated in the above table, the number of parities of the third bit and that of the fourth bit are not averaged by use of the vertical bit correction method.

In contrast, bit correction in the horizontal direction obtains the distribution of parities P1 and parities P2 with respect to each bit in a single symbol becomes that which is shown in FIG. 14. The distribution of parities P1 and P2 in a single bit becomes what is shown in the following table 4.

TABLE 4

Parity Distribution with Bit Correction in the Horizontal Direction

| Bit Position in 1 Symbol | The Number of Parities P1 | The Number of Parities P2 |
|---|---|---|
| Second Bit | 3 | 3 |
| Third Bit | 4 | 5 |
| Fourth Bit | 5 | 4 |

As indicated in the above table, it is possible to realize better averaging of the distribution of parities P1 and P2 in comparison with the previous bit correction method.

Figure 15:
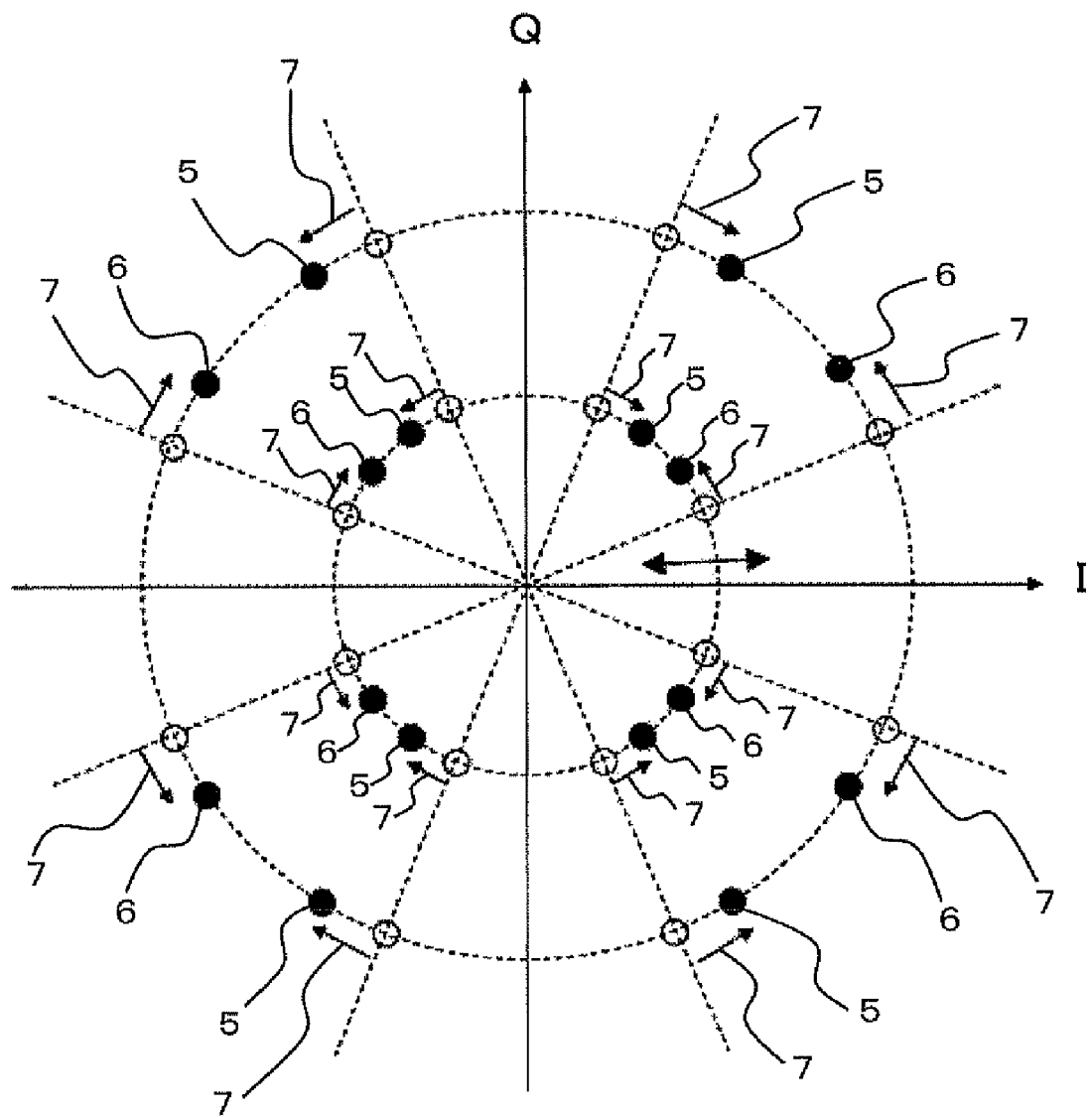
FIG. 15 is a symbol arrangement diagram for describing symbol arrangement control (when the likelihood of a first and a second bit is made to be large) in a case of (8, 8) star 16QAM in the second aspect of the first embodiment.

(2.2.4) Symbols to be Controlled in (8, 8) Star 16QAM:

In this case, as shown in FIG. 15, for example, the controller 18 performs symbol control to all of the 16 symbols. That is, the eight symbols (see the reference character 6) close to the I axis are controlled in a direction such that the symbols separate from each other (in the direction such that the symbols separate from the I axis; the eight symbols (see the reference character 5) close to the Q axis are also controlled in a direction such that the symbols separate from each other (in the direction such that the symbols separate from the Q axis). At that time, when the power should keep a fixed level, the symbols to be controlled are controlled along the same circle (see arrow 7). This enlarges the likelihood of the first bit and the second bit (the likelihood of the third bit becomes small because of a high symbol density). In this instance, to control the symbols along the same circle will not change the likelihood of the fourth bit.

Figure 16:
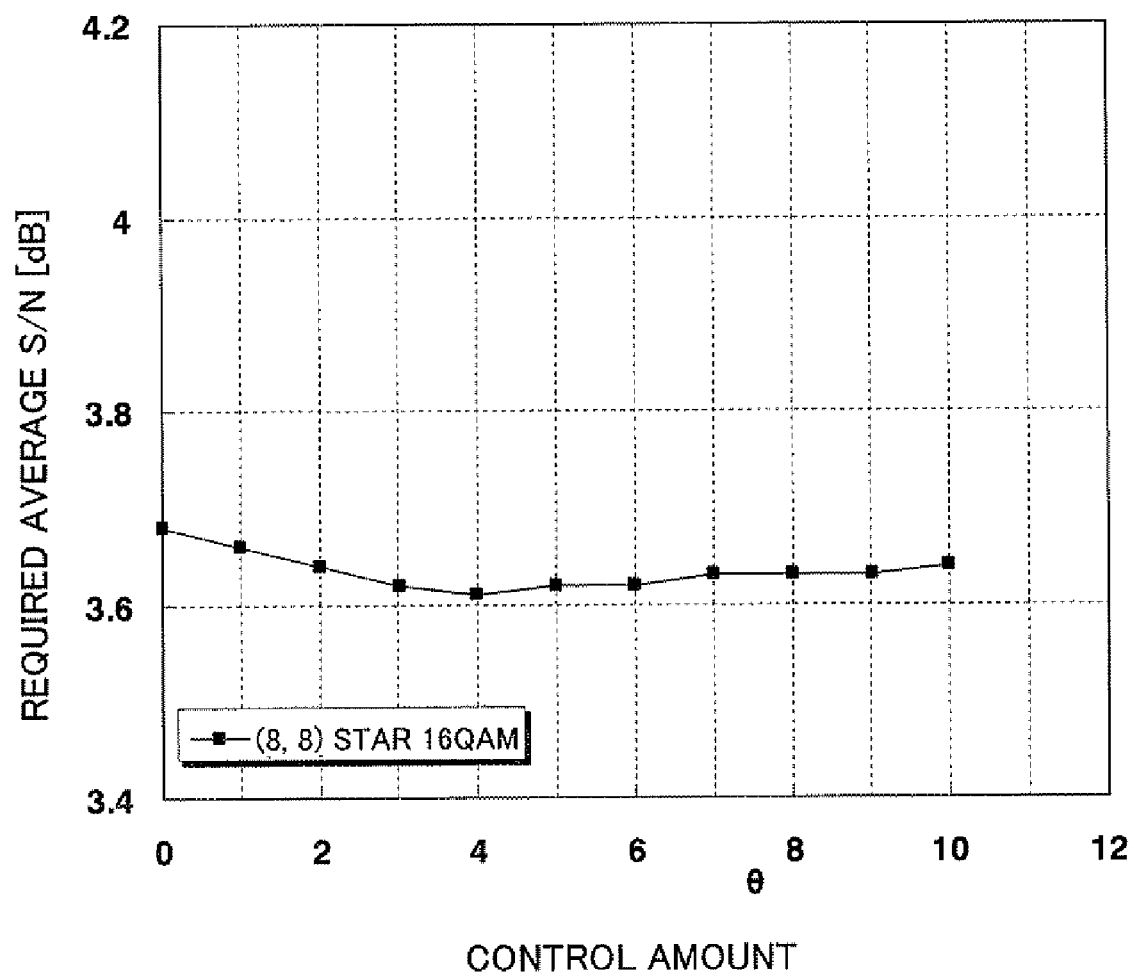
FIG. 16 is a graph indicating an example of a simulation result [an average S/N characteristic (@BLER=0.1) with respect to the symbol control amount] as a result of symbol arrangement control shown in FIG. 15.

With the symbols being controlled in such a manner, the likelihood of the third bit becomes larger, so that an error rate of the whole is generally improved up to a certain level, but further control of the symbols will contrarily deteriorate the likelihood of the third bit because of the likelihood of the third bit becoming too small. In this case, also, because of the above described reason, the optimal control amount depends on a radius ratio (the likelihood of the fourth bit) of the inner circle to the outer circle. Here, when the coding ratio=1/3, (8, 8) star 16QAM hardly shows any change in characteristics due to a radius ratio. Hence, as an example, a result of simulation in which symbols are controlled along the circles by an angle of θ at a radius ratio=1:1.5 as shown in FIG. 15 is shown in FIG. 16. That is, the simulation result indicates a required average S/N characteristic satisfying BLER=0.1 with respect to θ. From this FIG. 16, it is understandable that the best characteristic can be obtained in a case where θ=4°.

In this instance, in FIG. 16, a coding ratio=1/3 is given for making agree to the graph of FIG. 12 in a case of (4, 12) circular 16QAM. However, it is also possible to specify the optimal radius ratio because change of characteristics due to a radius ratio in a case where the coding ratio takes a different value (for example, the coding ratio=1/2, or the like).

(2.3) Third Aspect (In a Case Where the Likelihood of the Third and the Fourth Bit is Enlarged):

For example, as shown in FIG. 17, when systematic bits (S1 through S22) are allocated (see the shaded part) to the middle of the first bit through the third bit in bit correction processing at a coding ratio not smaller than 1/2 and not larger than 3/4, the likelihood of the third bit and the fourth bit to which parity bits P1 and P2 (S1 through S12) are allocated is enlarged on the receiver 2, since the significance of parity bits (P1 and P2), few in number, is increased.

In this case, also, as in the case of the second modification, the bit correction method is changed only in a case of (8, 8) star 16QAM. Since change of the bit correction method in the horizontal direction does not bring about a significant difference in characteristics in a case of grid-like 16QAM and (4,12) circular 16QAM, the vertical bit correction is available.

Figure 18:
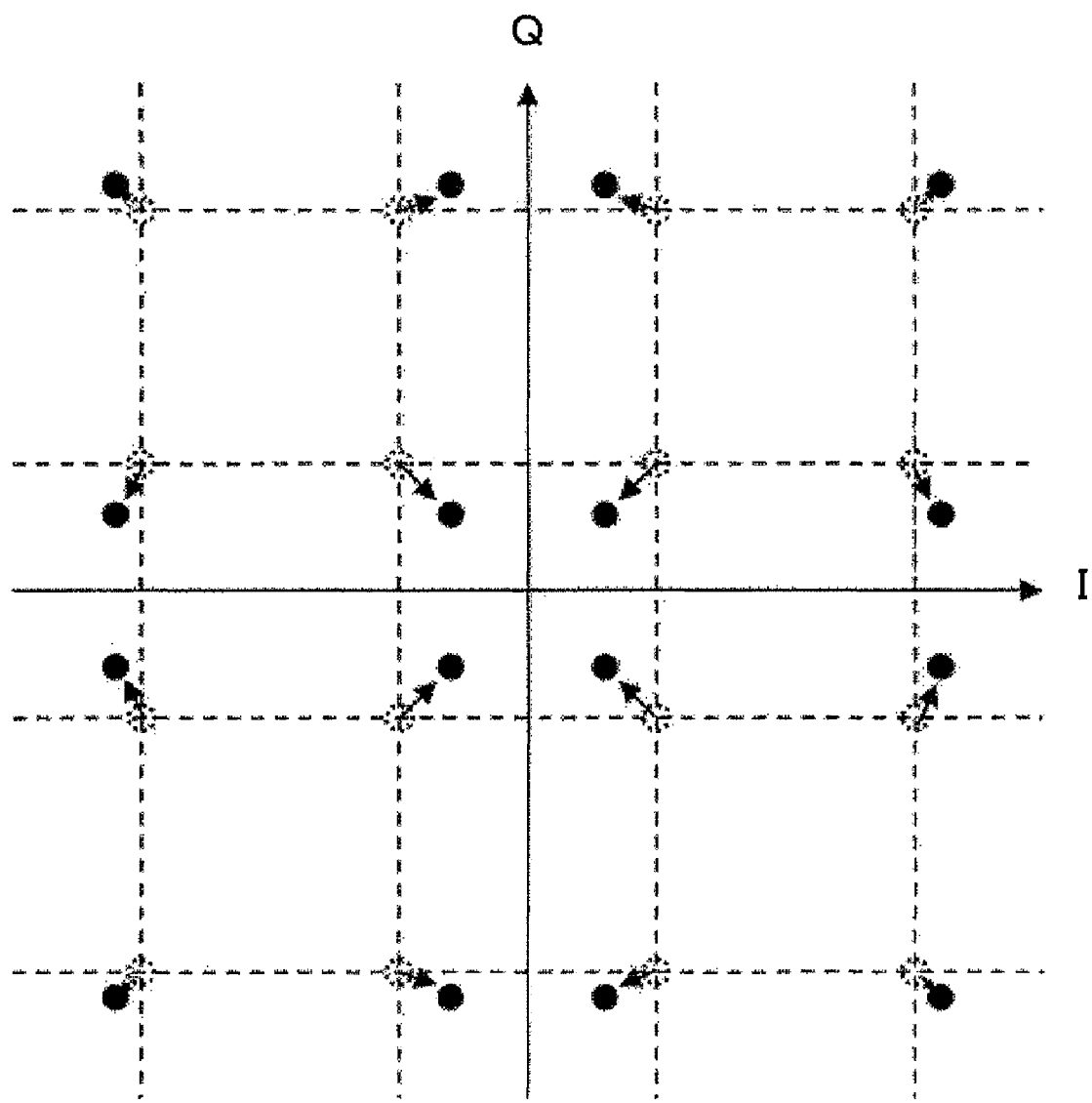
FIG. 18 is a symbol arrangement diagram for describing symbol arrangement control (when the likelihood of a third bit and a fourth bit is made to be large) in a case of grid-like 16QAM in the third aspect of the first embodiment.

(2.3.1) In a Case of the Grid-Like 16QAM:

In this case, as shown in FIG. 18, for example, the controller 18 performs symbol control to all the 16 symbols. That is, the eight inner symbols close to the I axis and the Q axis are controlled in a direction such that the symbols approach the I axis and the Q axis. At that time, when the power should keep a fixed level, the outer (apart from the I axis and the Q axis) symbols are controlled outwardly since the inner symbols (close to the I axis and the Q axis) are controlled inwardly. This enlarges the likelihood of the third bit and the fourth bit (the likelihood of the first and the second bit becomes small).

In the present example, with the symbols being controlled as described above, an error rate of the whole is generally improved to a certain level according to the control amount of the symbols due to the effect of enlarging of the likelihood of the parities. However, further symbol control will contrarily deteriorate characteristic because the likelihood of the first bit and the second bit becomes too small.

(2.3.2) In a Case of (4, 12) Circular 16QAM:

In this case, as shown in FIG. 19, for example, the controller 18 performs symbol control to a total of eight symbols, the four symbols (see the reference character 6) close to the real axis (I) and he four symbols (see the reference character 5) close to the imaginary axis (Q axis), in such a manner that the symbols approach the I axis and the Q axis, respectively. At that time, when the power should keep a fixed level, the symbols to be controlled are controlled along the same circle (see the arrow 7). This enlarges the likelihood of the third bit and the fourth bit (the likelihood of the first bit and the second bit is made to be small because of a high symbol density).

In this case, also, with the symbols being moved as described above, an error rate of the whole is generally improved to a certain level according to the control amount of the symbols due to the effect of enlarging of the likelihood of the parities. However, further symbol control will deteriorate characteristics because the likelihood of the first bit and the second bit becomes too small.

(2.3.3) In a Case of (8, 8) Star 16QAM:

In this case, the controller 18 changes the bit correction method, in addition to changing the symbol arrangement from an averaged arrangement as in the case of the first aspect, so that a better optimization can be realized. Provisionally, if the vertical bit correction is performed, the result becomes that which is shown in FIG. 20. That is, the distribution of parities P1 and P2 for each bit in a single symbol becomes what is shown in the following table 5.

TABLE 5

Parity Distribution with Bit Correction in the Vertical Direction

| Bit Position in 1 Symbol | The Number of Parities P1 | The Number of Parities P2 |
|---|---|---|
| Third Bit | 0 | 5 |
| Fourth Bit | 7 | 2 |

As shown in the above table, the vertical bit correction method is incapable of averaging the number of parities of the third bit and the fourth bit between the parity P1 and the parity P2.

In contrast, the horizontal bit correction exhibits a result shown in FIG. 21, and the distribution of the parities P1 and P2 for each bit in a single symbol becomes that which is shown in the following table 6.

TABLE 6

Parity Distribution with Bit Correction in the Horizontal Direction

| Bit Position in 1 Symbol | The Number of Parities P1 | The Number of Parities P2 |
|---|---|---|
| Third Bit | 2 | 3 |
| Fourth Bit | 5 | 4 |

As shown in the above table, it is possible to realize better averaging of the distribution of the parities P1 and P2 in comparison with the vertical bit correction method.

Figure 22:
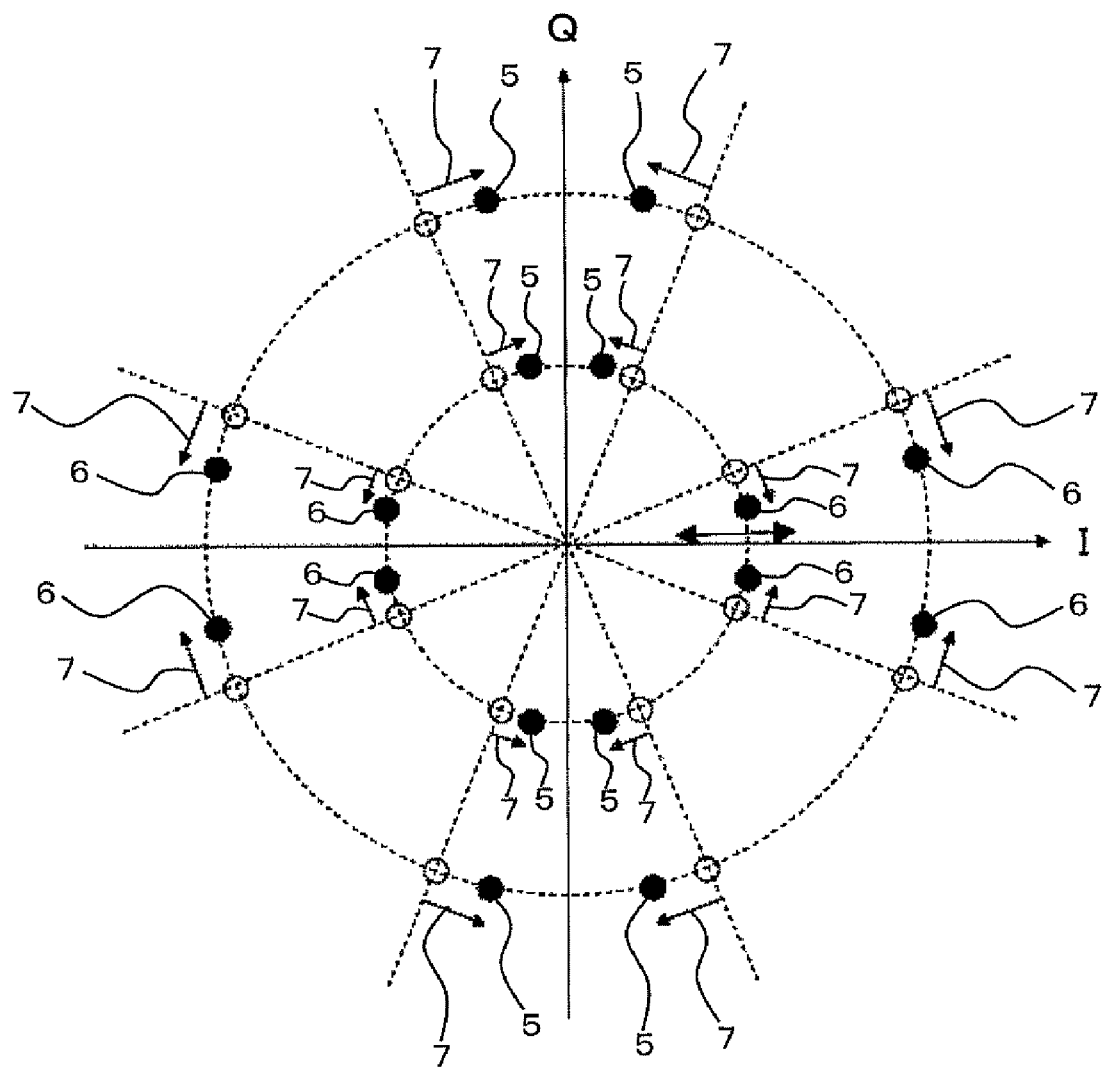
FIG. 22 is a symbol arrangement diagram for describing symbol arrangement control (when the likelihood of a third and a fourth bit is made to be large) in a case of (4, 12) circular 16QAM in the third aspect of the first embodiment.

(2.3.4) Symbols Moved in (8, 8) Star 16QAM:

As shown in FIG. 22, the controller 18 performs symbol control to all the 16 symbols. That is, the eight symbols (see the reference character 6) close to the I axis are controlled in a direction such that the symbols approach each other (in a direction such that the symbols become closer to the I axis) and also the eight symbols (see the reference character 5) close to the Q axis are controlled in a direction such that the symbols approach each other (in a direction such that the symbols approach the Q axis. At that time, when the electric power should keep a fixed level, the symbols to be controlled are controlled along the respective same circles (see the arrow 7). This enlarges the likelihood of the third bit (the likelihood of the first and the second bit becomes small). In addition, enlarging a radius ratio of the inner circle to the outer circle (see the arrow 8) enables enlargement of the fourth bit.

As described above, with the symbols being controlled, an error rate of the whole is generally improved up to a certain level according to the control amount of the symbols due to the effect of enlarging of the likelihood of the parities. However, further symbol control will contrarily deteriorate characteristics because the likelihood of the first and the second bit becomes too small.

(2.4) Fourth Aspect (In a Case Where the Likelihood Only of the Fourth Bit is Enlarged)

For example, as shown in FIG. 23, when systematic bits (S1 through S27) are allocated (see the shaded part) to all the bits, the first bit through the third bit, in bit correction processing at a coding ratio of not smaller than 3/4, the likelihood only of the fourth bit to which the parity bits (P1 and P2) are allocated is enlarged.

In this case, the vertical bit correction is available since changing the bit correction method into in the horizontal direction does not bring about a significant difference in effect (bit arrangement) in comparison with the vertical bit correction method.

Figure 24:
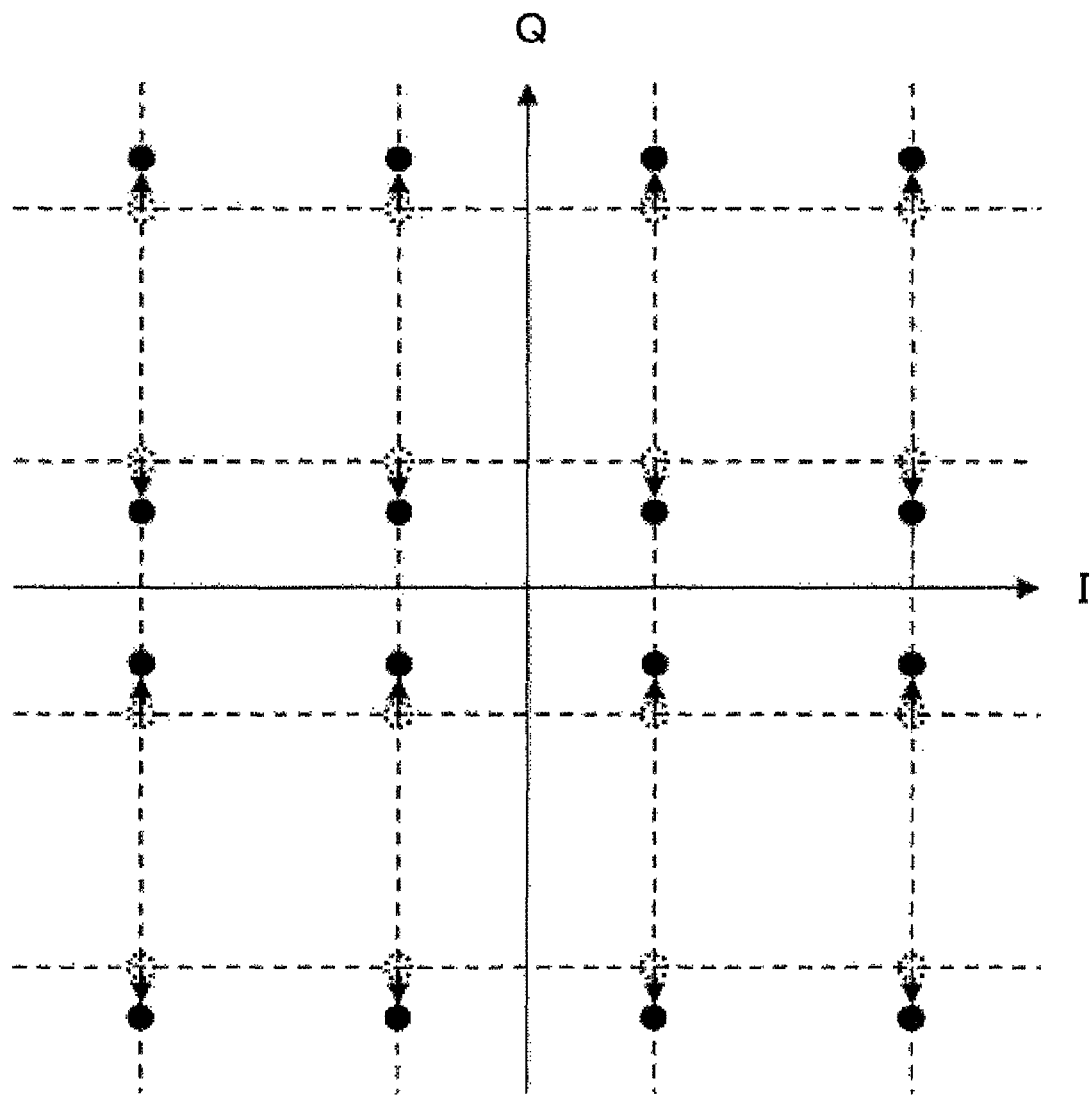
FIG. 24 is a symbol arrangement diagram for describing symbol arrangement control (when the likelihood of a fourth bit is made to be large) in a case of grid-like 16QAM in the fourth aspect of the first embodiment.

(2.4.1) In a Case of Grid-Like 16QAM:

In this case, as shown in FIG. 24, the controller 18 performs symbol control to all the 16 symbols. That is, the eight symbols close to the I axis are controlled inwardly (in a direction such that the symbols become closer to the I axis) and also the eight symbols apart from the Q axis are controlled outwardly (in a direction such that the symbols separates from the I axis). This enlarges the likelihood of the fourth bit (the likelihood of the second bit becomes small). In this instance, the likelihood of the first and the third bit is not changed.

In this case, also, with the symbols being controlled, an error rate of the whole is generally improved up to a certain level according to the symbol control amount due to the effect of enlarging of the likelihood of the parity bits. However, further symbol control will contrarily deteriorate characteristics because the likelihood of the second bit becomes too small.

Figure 25:
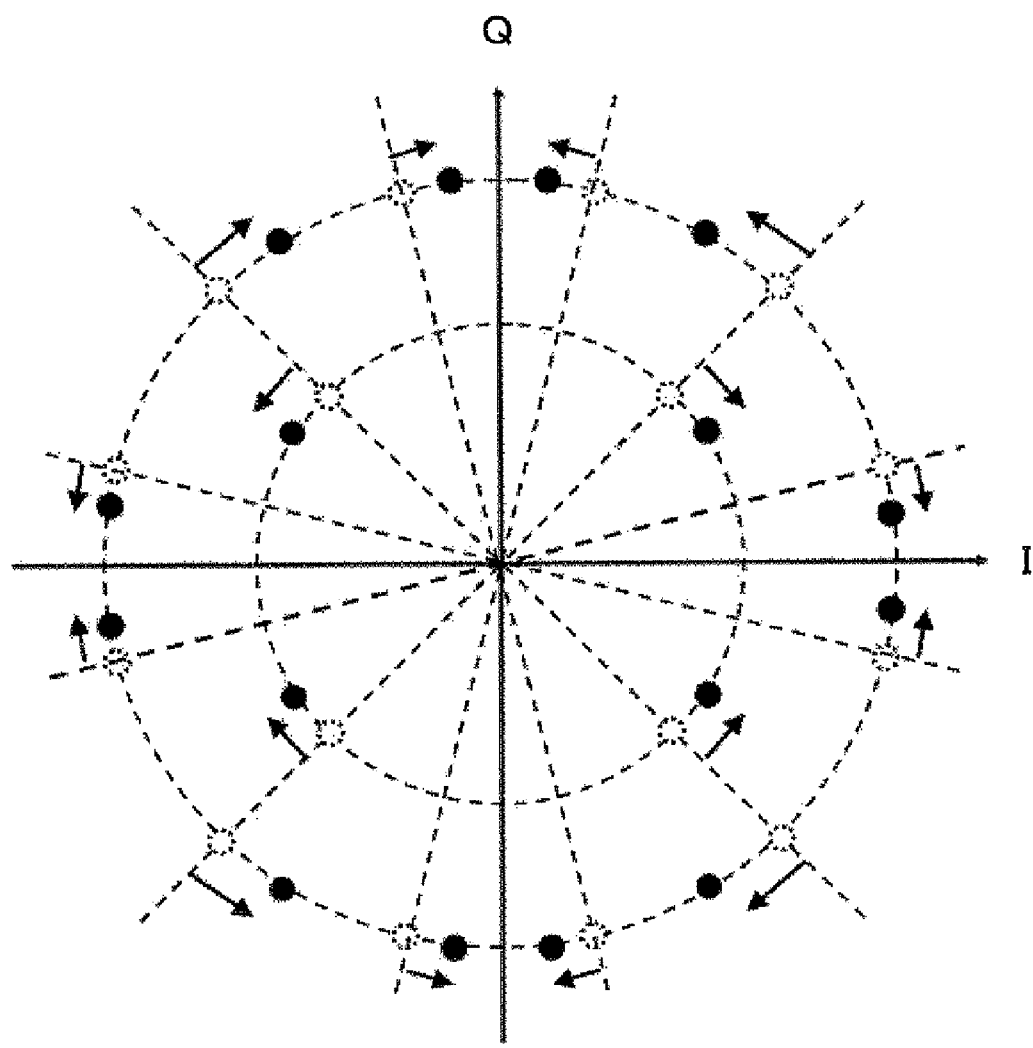
FIG. 25 is a symbol arrangement diagram for describing symbol arrangement control (when the likelihood of a fourth bit is made to be large) in a case of (4, 12) circular 16QAM in the fourth aspect of the first embodiment.
Figure 26:
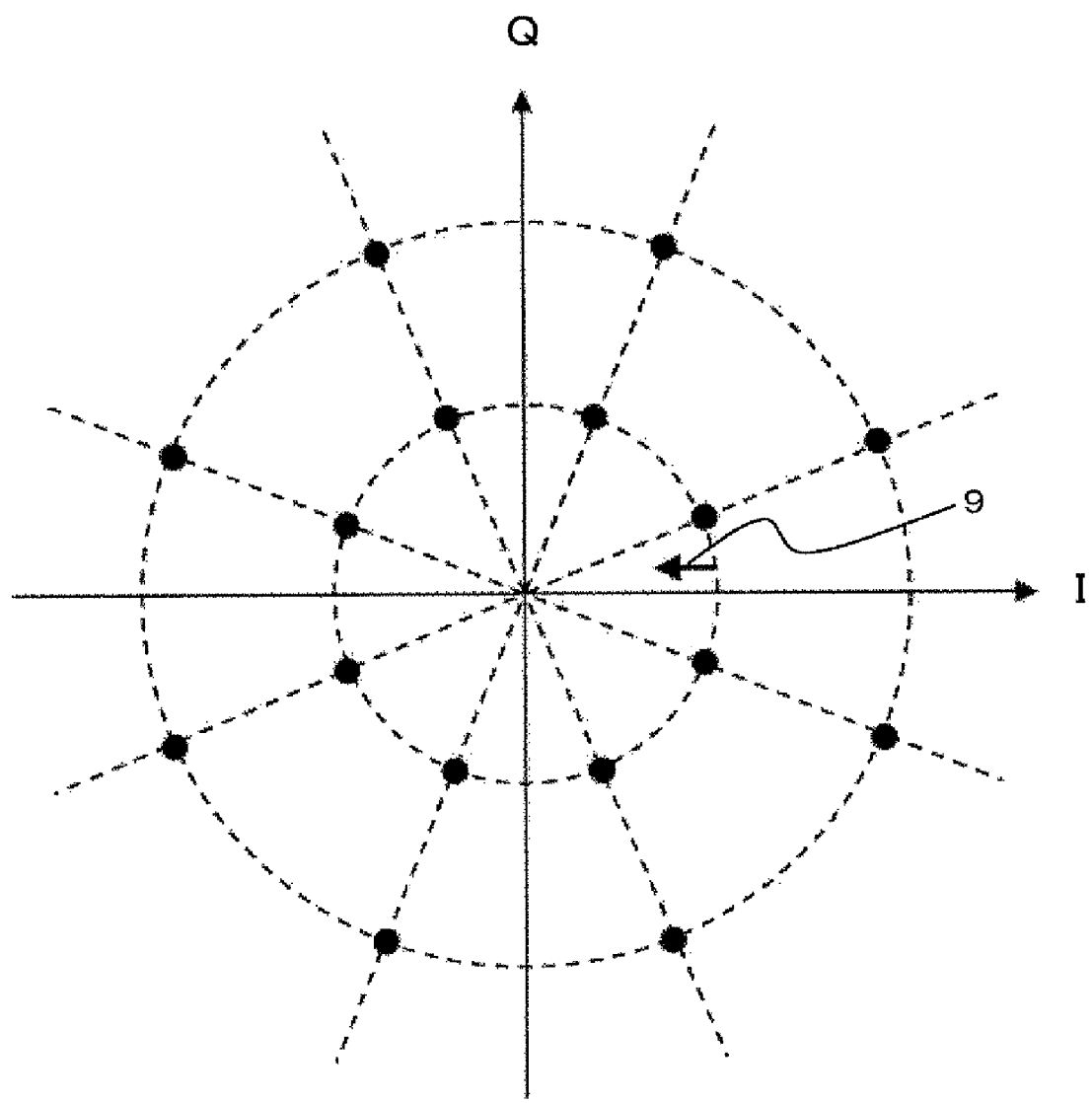
FIG. 26 is a symbol arrangement diagram for describing symbol arrangement control (when the likelihood of a fourth bit is made to be large) in a case of (8, 8) star 16QAM in the fourth aspect of the first embodiment.

(2.4.2) In a Case of (4, 12) Circular 16QAM:

In this case, as shown in FIG. 25, the controller 18 performs symbol control such that the eight symbols close to the real axis (I axis) and the eight symbols close to the imaginary axis (Q axis) come closer to the I axis and the Q axis, respectively. At that time, when the power should keep a fixed level, the symbols to be controlled are controlled along the respective same circles. This enlarges the likelihood of the fourth bit (the likelihood of the first and the second bit becomes small).

In this case, also, with the symbols being controlled, an error rate of the whole is generally improved up to a certain amount level according to the symbol controlled amount due to the effect of enlarging of the likelihood of the parity bits. However, further symbol control will deteriorate characteristics because the likelihood of the first bit and the second bit becomes too small.

(2.4.3) In a Case of (8, 8) Star 16QAM:

In this case, the controller 18 performs control such that a radius ratio of the inner circle to the outer circle becomes small (see the arrow 9). At that time, when the power should keep a fixed level, not only the radius of the inner circle but also that of the outer circle is changed. This enlarges the likelihood of the fourth bit (the likelihood of the first, the second bit, and the third bit becomes small).

With the radius ratio being changed in such a manner, an error rate of the whole is gradually improved because of the effect of enlarging of the likelihood of the parities up to a certain level according to the change of the radius ratio. However, further control will make the likelihood of the first, the second, and the third bit too small, so that characteristics will contrarily deteriorate.

Figure 28:
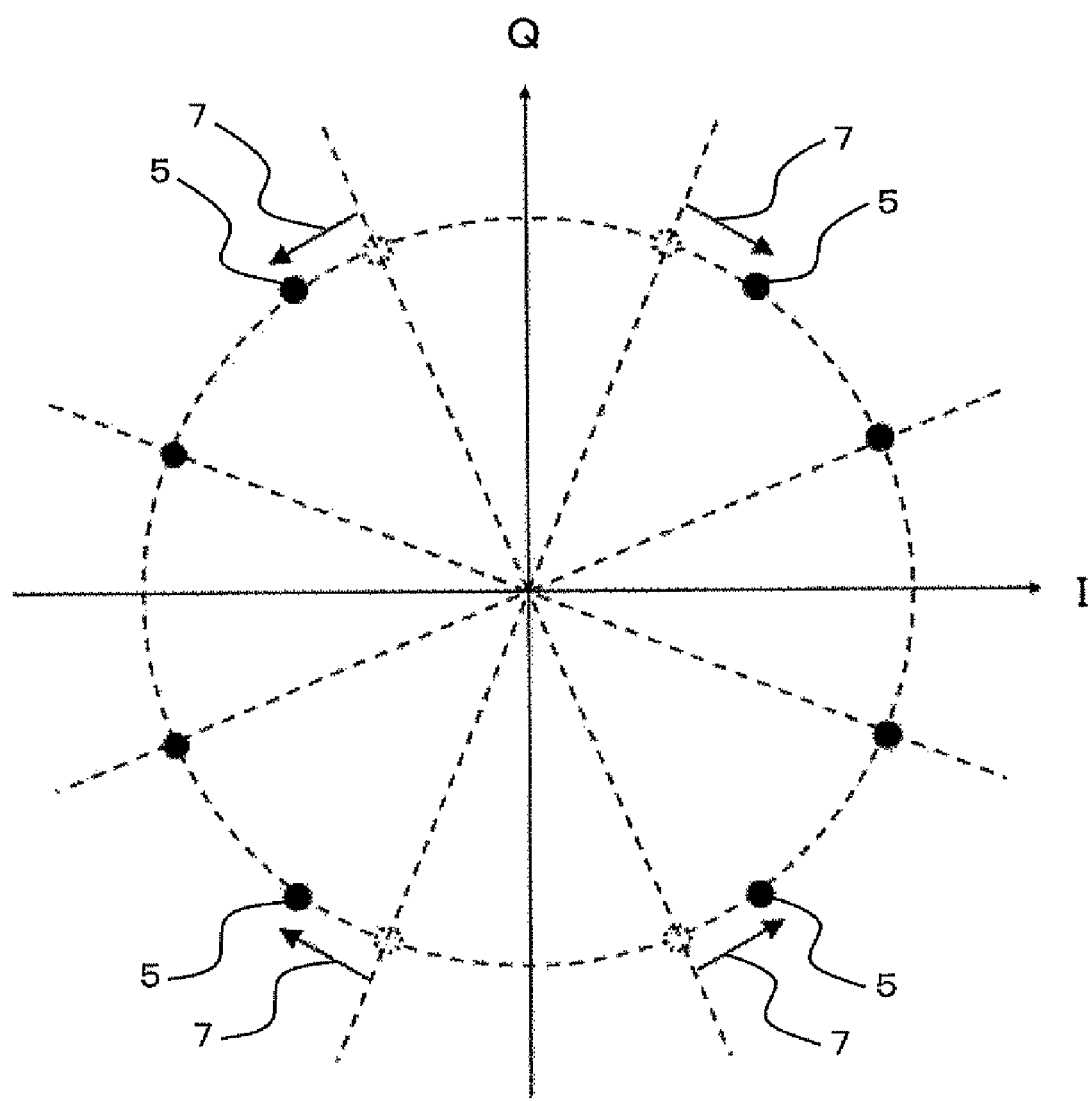
FIG. 28 is a symbol arrangement diagram for describing symbol arrangement control (when the likelihood of a first is made to be large) in a case of 8PSK in the fifth aspect of the first embodiment.

(2.5) Fifth Aspect (In a Case of 8PSK):

(2.5.1) For Enlarging the Likelihood of the First Bit:

In a case of 8PSK, also, the controller 18 changes the bit correction method used by the bit corrector 14 (performs a horizontal bit correction) (see FIG. 27). Further, as shown FIG. 28, the controller 18 performs symbol control of the four symbols (see the reference character 5) the closest to the imaginary axis (Q axis) in a direction such that the symbols separate from each other. At that time, when the power should keep a fixed level, the symbols to be controlled are controlled along the circle (see the arrow 7).

Figure 30:
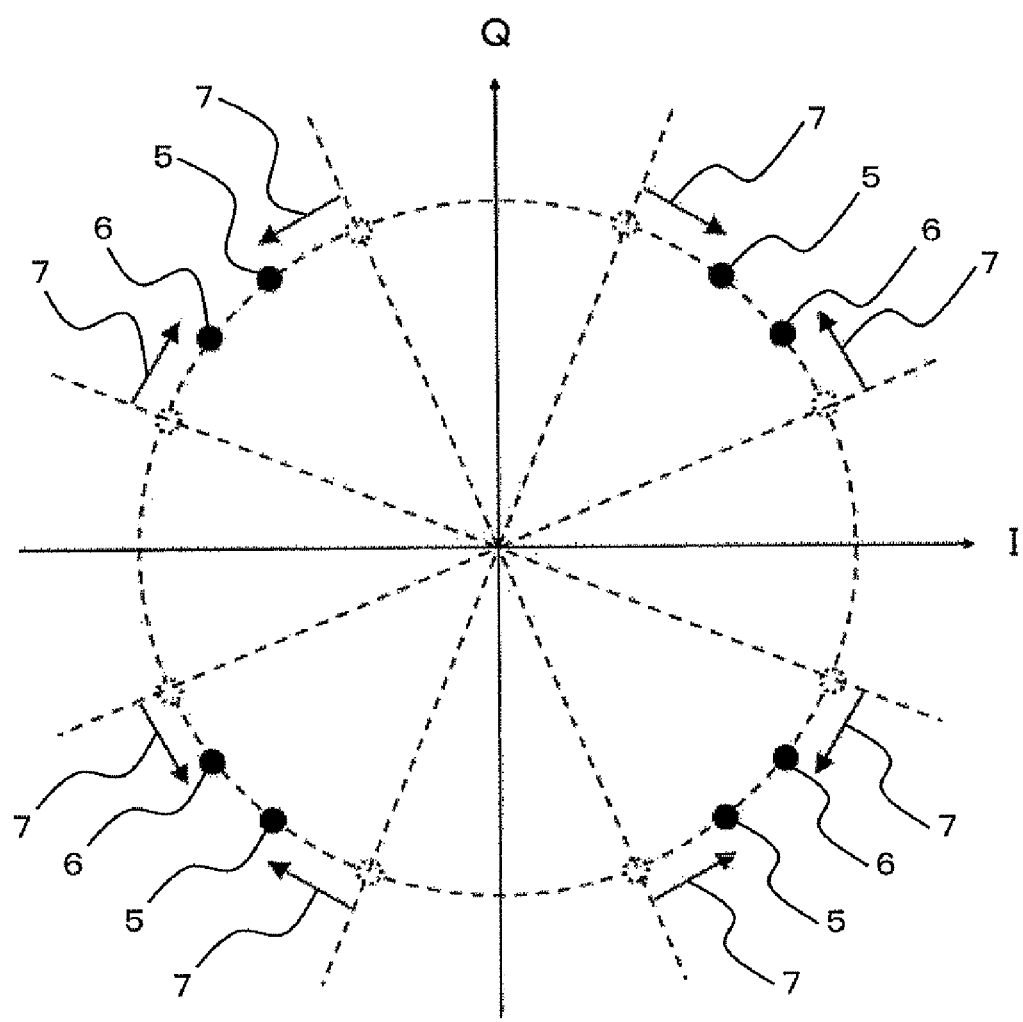
FIG. 30 is a symbol arrangement diagram for describing symbol arrangement control (when the likelihood of a first and a second bit is made to be large) in a case of 8PSK in the fifth aspect of the first embodiment.

(2.5.2) In a Case Where Systematic Bits are Allocated to the Middle of the Second Bit:

In this case, also, as shown in FIG. 29, the controller 18 changes the bit correction method used by the bit corrector 14 (horizontal bit correction is performed). Further, the controller 18 performs symbol control to all the eight symbols as shown in FIG. 30. That is, the four symbols (see the reference character 5) close to the imaginary axis (Q axis) are controlled in a direction so as to separate from the Q axis; the four symbols (see the reference character 6) close to the real axis (I axis) are controlled so as to separate from the I axis. At that time, in a case where the power should maintain a fixed level, the symbols to be controlled are controlled along the circle (see the arrow 7).

Figure 32:
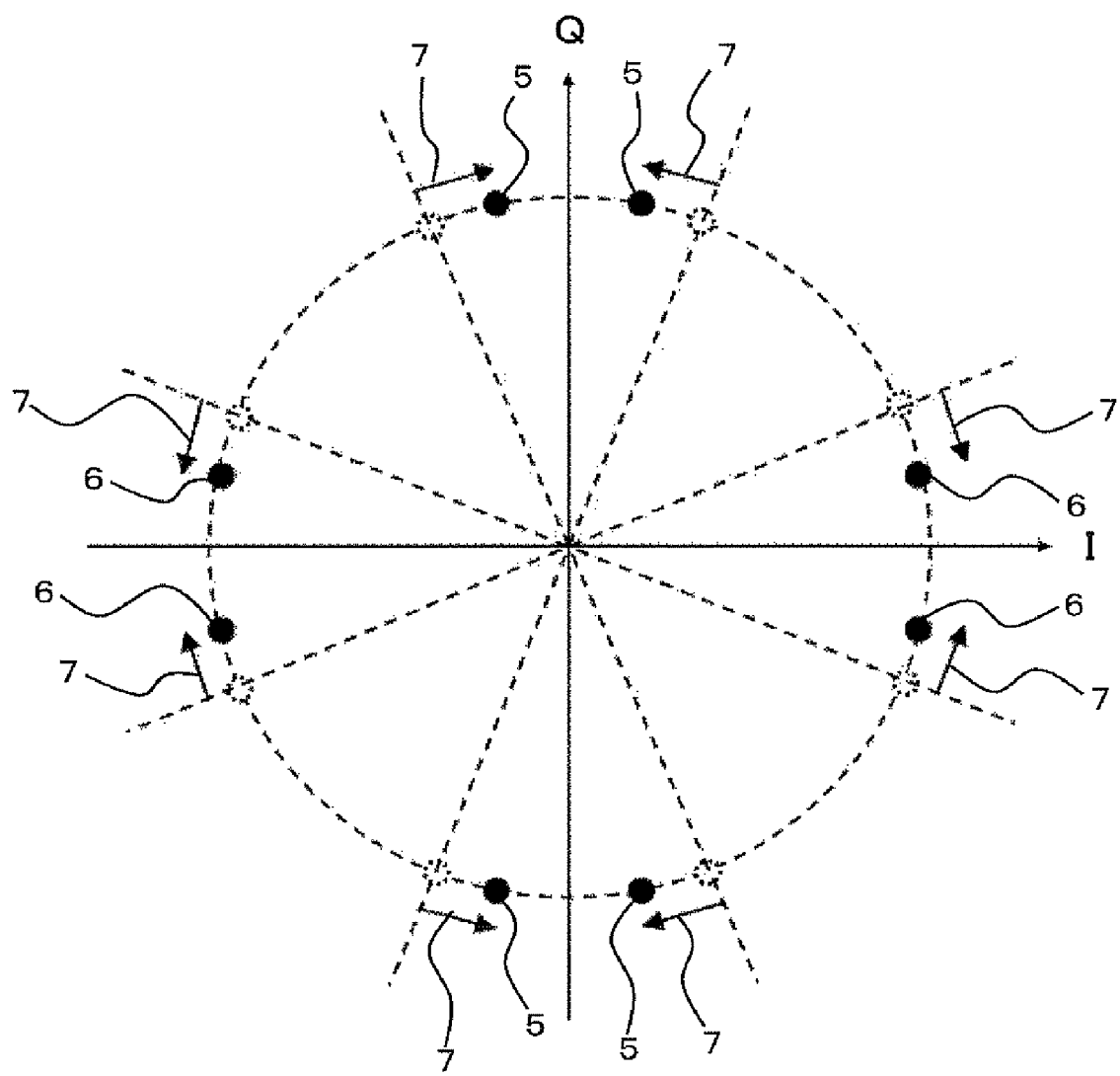
FIG. 32 is a symbol arrangement diagram for describing symbol arrangement control (when the likelihood of a third bit is made to be large) in a case of 8PSK in the fifth aspect of the first embodiment.

(2.5.3) In a Case Where Systematic Bits are Allocated to the Middle of the Third Bit (see FIG. 31):

In this case, the vertical bit correction method is available since there is no point in changing the bit correction method (allocation becomes the same). The controller 18, as shown in FIG. 32, performs symbol control to all the eight symbols. That is, the four symbols (see the reference character 5) close to the Q axis are controlled in a direction so as to come closer to the Q axis; the four symbols (see the reference character 6) close to the I axis are moved so as to come closer to the I axis. At that time, in a case where the power should maintain a fixed level, the symbols to be controlled are controlled along the circle.

Figure 33:
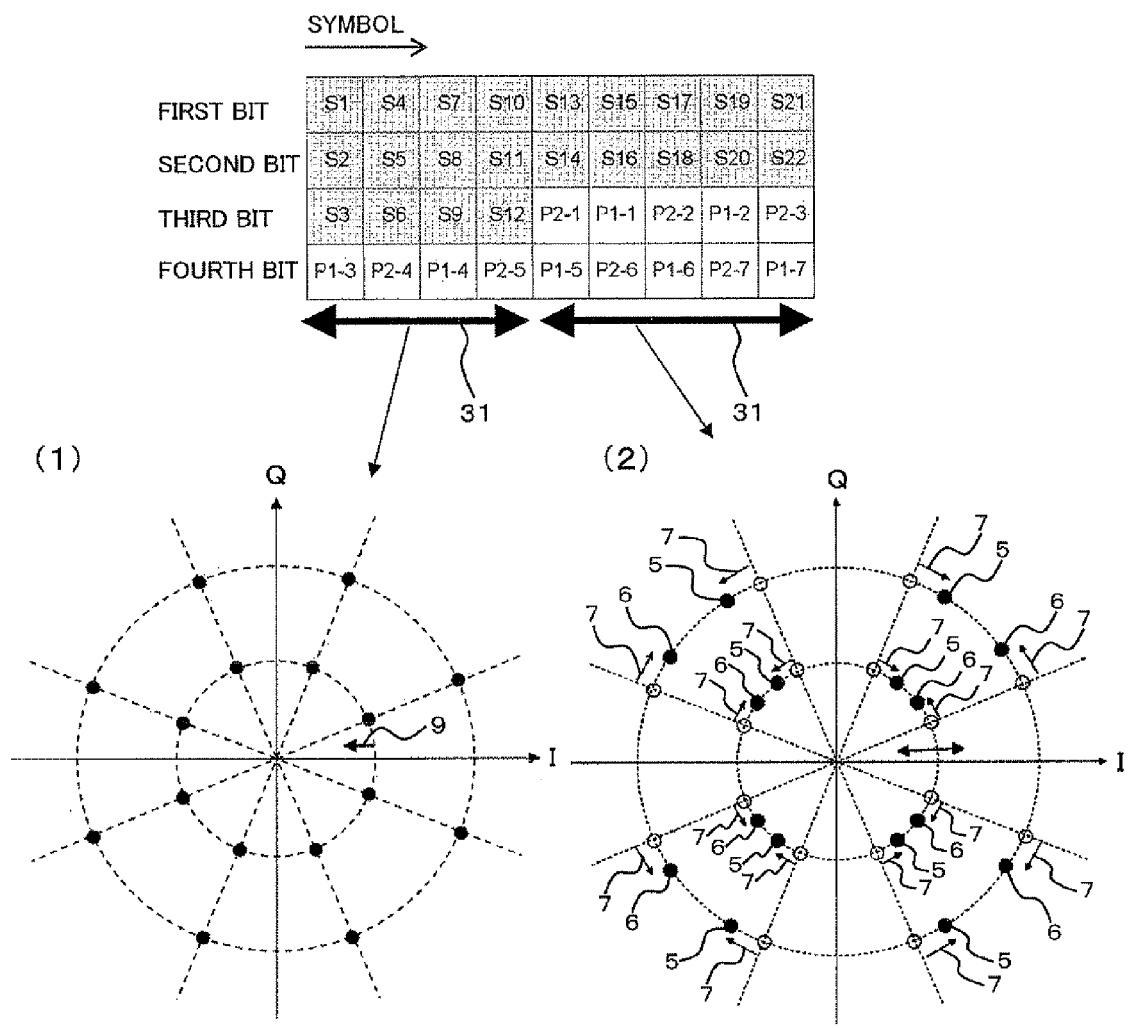
FIG. 33 is a diagram illustrating an example of bit arrangement and a symbol arrangement for describing an example in which symbol arrangement control is changed in accordance with time.

(2.6) In a Case Where Symbol Control is Changed in Accordance with Time [As an Example, in a Case of (8, 8) Star 16QAM]:

Adaptively changing the above described methods of the first through the fourth aspects with elapse of time makes possible a better optimization. That is, the controller 18, as shown in FIG. 33, controls the beginning four symbols (see the both of the thick solid arrows 31) in such a manner that a radius ratio of the inner circle to the outer circle becomes large as shown in (1) of FIG. 32 by means of applying the above described fourth aspect. As to the subsequent five symbols (see the thick solid arrow 32), the controller 18 applies the second aspect, for example, to control the symbols, as shown in (2) of FIG. 33, so as to increase an error resistance of the systematic bits S.

In this instance, although FIG. 33 shows a case of (8, 8) star 16QAM, the same operation can be similarly executed in the cases of (4, 12) circular 16QAM, grid-like 16QAM, and 8PSK. In addition, the same operation can be carried out in a case where the systematic bits are allocated to the middle of the first bit, in a case where those are allocated to the middle of the second bit, and in a case where those are allocated to the middle of the fourth bit.

(2.7) In a Case Where Systematic Bits and Parity Bits are Exchanged:

The above described examples are described on the assumption that systematic bits are sequentially arranged beginning from the first bit. With such systematic bits being increased, systematic bits are allocated also to the second bit and the third bit. However, it is considerable that bit allocation is performed beginning from parity bits of the first bit, inversing the relationship between systematic bits and parity bits (for example, see Chapter 4.5.4.3, Chapter 4.5.7, and Chapter 4.6.2.1, etc., of the above non-patent document 5).

The above described methods can support also such a case. That is, when the number of parity bits is small, the symbols can be controlled in such a manner that the likelihood of the bits which are allocated to parity bits becomes large. When the number of parity bits is large, the symbols can be controlled in such a manner that the likelihood of the systematic bits becomes large.

In this manner, the symbol arrangement is controlled to be changed from an equal interval arrangement in accordance with the coding ratio (a ratio of systematic bits to parity bits), an error rate in the 16-level or the 8-level modulation scheme with use of turbo codes being thereby improved. This is because, in bit correction processing, sufficient effect of bit correction processing cannot be obtained with the previous symbol (signal point) arrangement, in which 16 symbols are arranged at equal intervals, but the effect of bit correction processing becomes large as a result of controlling the symbols from the equal interval arrangement, thereby enlarging the likelihood of the demanded bits so that the systematic bits (or parities) of high significance are hardly received erroneously. As a result, the effect of bit correction becomes large.

[3] Second Embodiment

Figure 34:
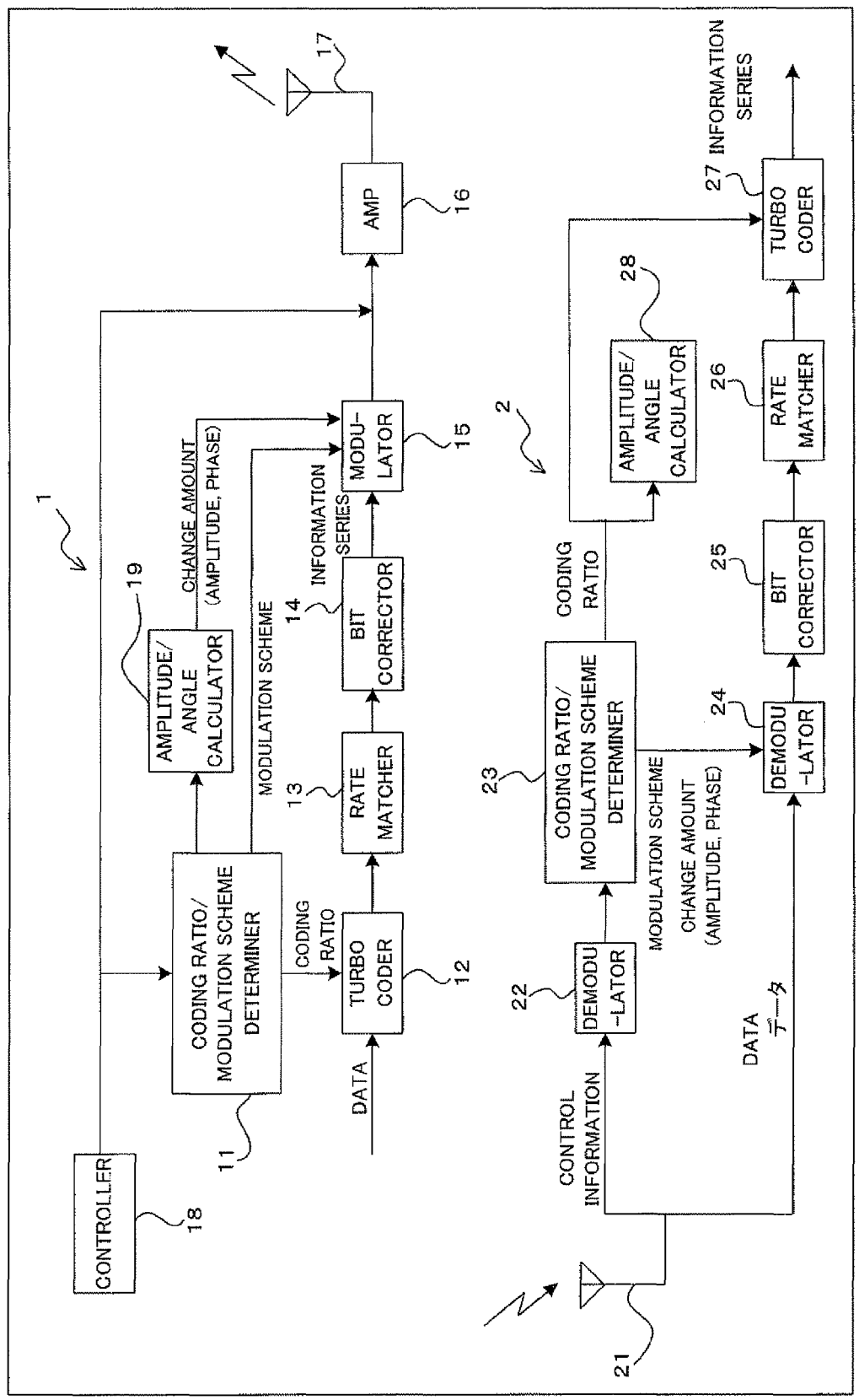
FIG. 34 is a block diagram illustrating a construction of a digital radio communications system using turbo coding and bit correction according to a second embodiment.

FIG. 34 is a block diagram illustrating a construction of a digital radio communications system using turbo coding and bit correction according to a second embodiment. As in the case of the first embodiment, the digital radio communications system shown in FIG. 34 includes a transmitter 1 and a receiver 2. The transmitter 1 is applicable to, for example, a radio base transceiving station (BTS); the receiver 2 is applicable to, for example, a mobile station (MS). The second embodiment differs from the construction shown in FIG. 2 in that an amplitude/angle calculator 19 is added to the transmitter 1 and that the amplitude/angle calculator 28 is added to the receiver 2. In this instance, elements with reference characters the same as those already described are the same as or similar to the elements already described.

Figure 35:
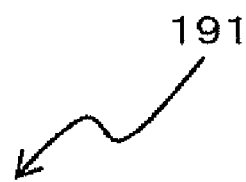
FIG. 35 is an example of a conversion table for use in an amplitude/angle calculator shown in FIG. 34.
Figure 36:
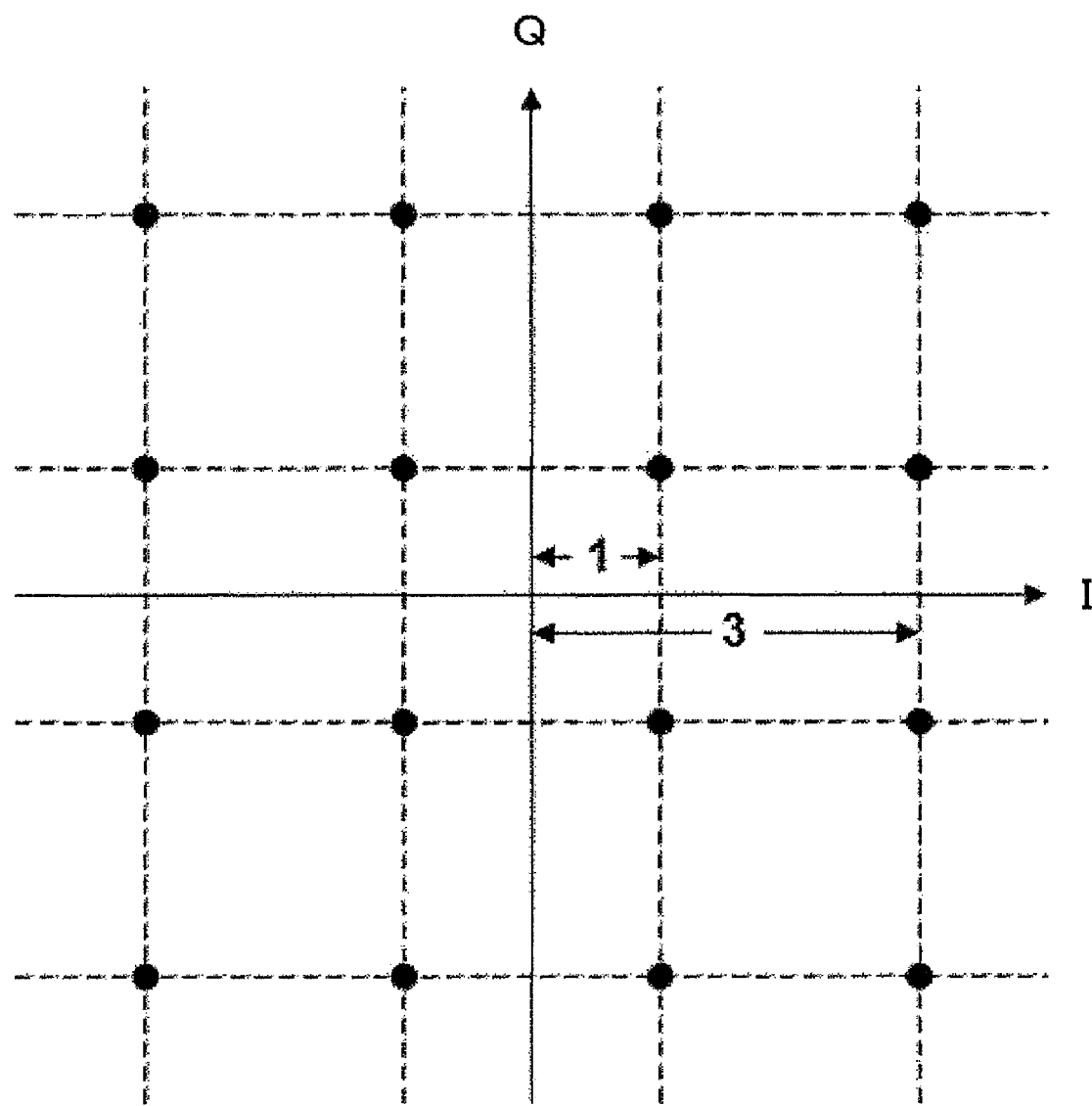
FIG. 36 is a diagram illustrating a symbol arrangement under previous grid-like 16QAM.
Figure 37:
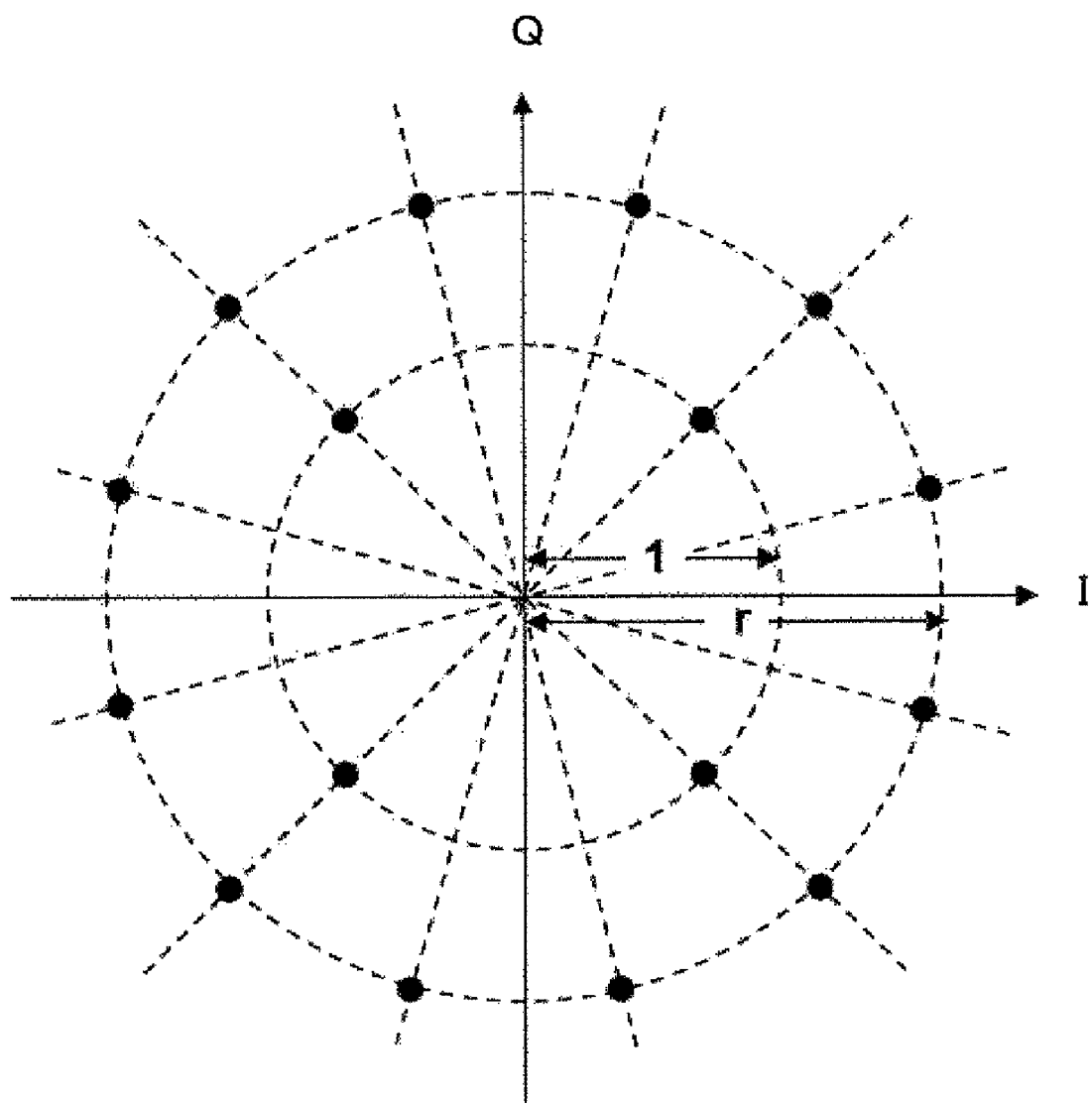
FIG. 37 is a diagram illustrating a symbol arrangement under (4, 12) circular 16QAM.
Figure 38:
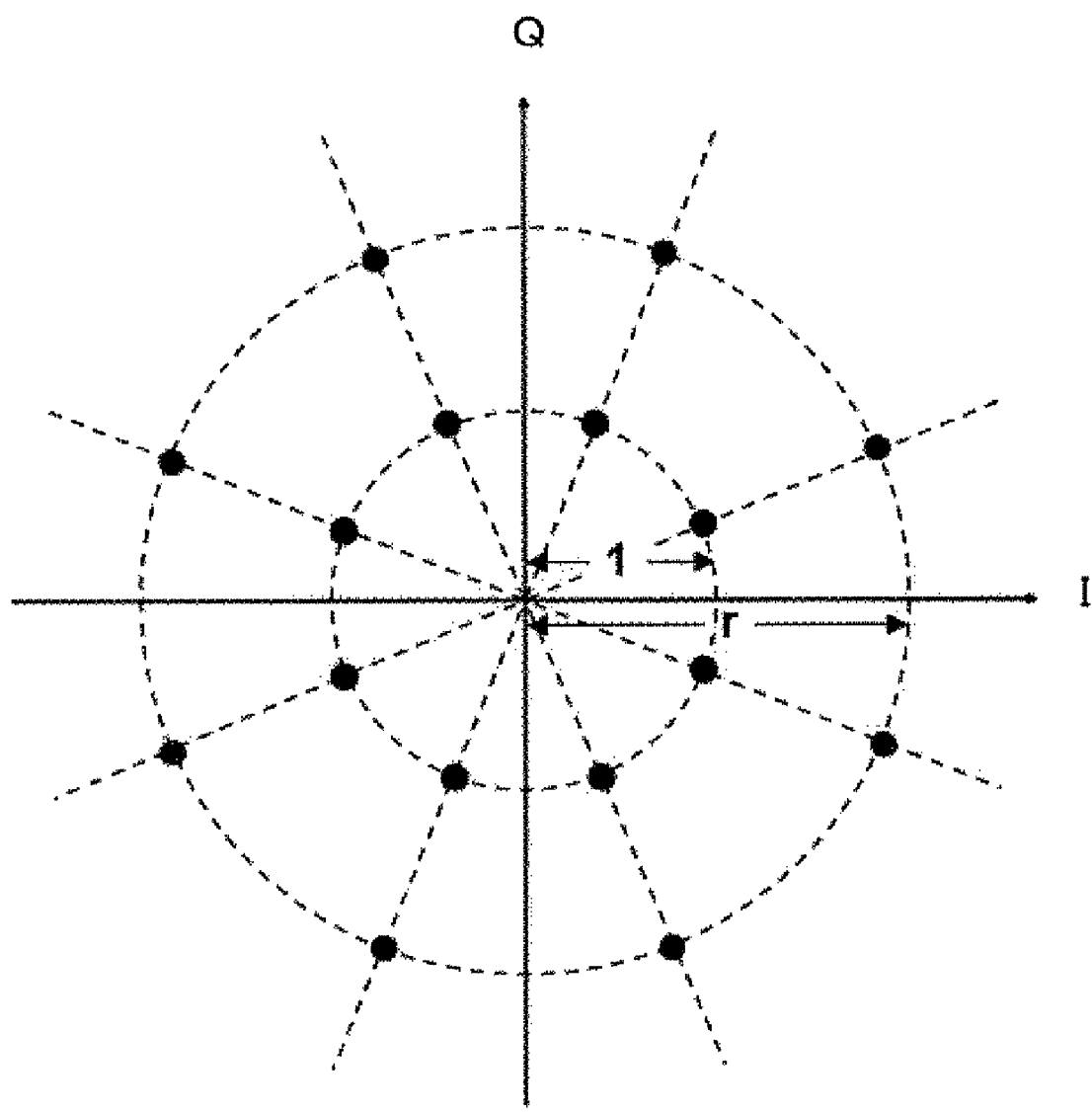
FIG. 38 is a diagram illustrating a symbol arrangement under (8, 8) star 16QAM.
Figure 39:
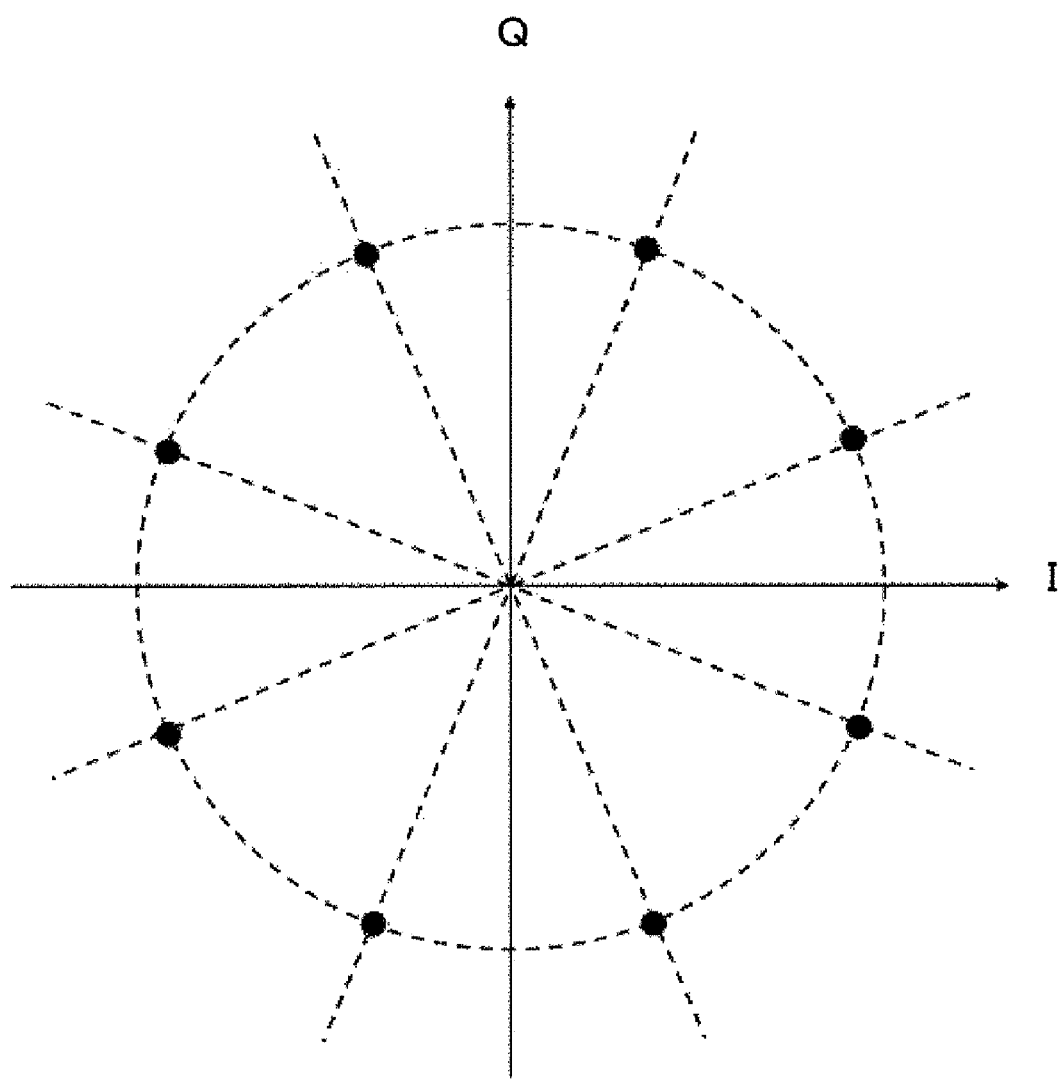
FIG. 39 is a diagram illustrating a symbol arrangement under 8PSK.

Here, as shown in FIG. 35, for example, the amplitude/angle calculator (symbol control amount calculating unit) 19 of the transmitter 1 stores beforehand the amplitude ratios a(i) and the angles θ(i) (here, i=1 through n) corresponding to the coding ratios [R(0) through R(1), R(1) through R(2), . . . , R(n−1) through R(n): n is an integer equal to or larger than 2] (transmission block size) and an RV parameter, as data 191 in a form of a table (hereinafter, will be called the conversion table 191), in a memory or the like, which is not illustrated. The amplitude/angle calculator 19 is capable of reading from this conversion table 191 an amplitude ratio a(i) and an angle θ(i) as a symbol control amount corresponding to a coding ratio determined by the coding ratio/modulation scheme determiner 11, and then outputting the read out data 191 (notifying to the modulator 15).

In this instance, the "RV parameter" is mode setting information for setting a mode such as a mode in which the relationship between systematic bits and parity bits are inversed (that is, parity bits are allocated with high priority to the bits in a single symbol beginning from the first bit), a mode in which the rate matcher 13 punctures systematic bits with high priority, and a mode in which parity bits are punctured with high priority. In accordance with such mode setting, a ratio between the systematic bits and the parity bits in bit correction processing is changed.

Accordingly, systematic bits are sequentially allocated beginning from the first bit in a single symbol, and in a default mode, in which parity bits are punctured with high priority, it is only necessary that a conversion table 191 be prepared in which amplitude ratios a(i) and angles θ(i) are simply associated with coding ratios. However, in modes other than the default mode, it is necessary to pay consideration to the RV parameter. In consequence, a conversion table 191 is necessary in which amplitude ratios a(i) and angles θ(i) are associated with each other corresponding to ratios of systematic bits to parity bits.

On the other hand, as in the case of the amplitude/angle calculator 19 of the transmitter 1, the amplitude/angle calculator (symbol control amount calculating unit) 28 of the receiver 2 stores beforehand the same conversion table 191 in a non-illustrated memory or the like as that provided for the transmitter 1 end. The amplitude/angle calculator 28 reads an amplitude ratio a(i) and an angle θ(i) from the conversion table 191 as symbol control amount information for a coding ratio determined by the coding ratio/modulation scheme determiner 23, and outputs the read out data (notifies to the demodulator 24). That is, the above mentioned memory holds codes of different significance, that is, information relating to symbol arrangements corresponding to ratios between systematic bits and parity bits.

In other words, the demodulator 24 reads symbol control amount information from the above memory (conversion table 191) based on information relating to a coding ratio (a ratio between systematic bits and parity bits) which is notified from the transmitter 1 as control information, and on the basis of the read out information, the demodulator 24 performs demodulation processing.

That is, according to the present embodiment, different from the first embodiment in which symbol control amount information, such as an amplitude ratio and an angle, on the transmitter lend is contained in control information (signaling packet) transmitted to the receiver 2, the same conversion tables 191 are provided beforehand for the both of the transmitter land the receiver 2. This makes possible equivalent processing of the first embodiment, without causing increase in an amount of control information.

Accordingly, in addition to an advantage of obtaining the effects and the benefits equivalent to those in the first embodiment, another advantage can be obtained that the receiver 2 is capable of performing, with high accuracy and speed, modulation and demodulation processing corresponding to change of bit correction and symbol arrangement on the transmitter 1 end, while attempting to realize efficient use of radio resources between the transmitter 1 and the receiver 2 in comparison with the first embodiment.

[4] Others a) Relationship Between Error Rate of Each Modulation Scheme and PAPR (Peak-to-Average Ratio):

When a coding ratio=1/3, the BER characteristic after decoding and the BLER characteristic may be any of the Raw BER characteristic, the BER characteristic after decoding, and the BLER characteristic. However, PAPR is large in comparison with (8, 8) star 16 QAM and (4, 12) circular 16QAM. The Raw BER characteristic in (8, 8) star 16QAM is the worst among those in the above three schemes, but the BER characteristic after decoding and the BLER characteristic are equivalent to those obtained in grid-like 16QAM. That is, it can be said that (8, 8) star 16QAM is a scheme in which the greatest effect of coding can be obtained. (4, 12) circular 16QAM exhibits the Raw BER characteristic, the BER characteristic after decoding, and the BLER characteristic worse than those in the grid-like 16QAM, but exhibits the smallest PAPR among that in the above mentioned three schemes.

That is, the relationship becomes what is shown below.

[Raw BER]

Grid-like 16QAM  >  (4, 12)  circular 16QAM  >  (8, 8) star 16QAM

Superior (good)  ◄——►  Inferior (bad)

[BER after decoding and BLER (coding ratio = 1/3) ]

Grid-like 16QAM  ≈  (8, 8)  star 16QAM  >  (4, 12) circular  16QAM

Superior (good)  ◄——►  Inferior (bad)

[PAPR]

(4, 12) circular 16QAM  >  (8, 8) star 16QAM  >  grid-like 16QAM

Superior (good)  ◄——►  Inferior (bad)

b) Idea of the Embodiments and its Effects to PAPR:

In grid-like 16QAM, when a coding ratio is smaller than 1/2, the outer symbols are controlled inwardly so as to collect in the inner direction as already described with reference to FIG. 9, so that PAPR becomes small. In contrast, when the coding ratio is larger than 1/2, the outer symbols are controlled so as to get apart from the center, so that PAPR becomes large as already described with reference to FIG. 17.

Further, in (8, 8) star 16QAM and (4, 12) circular 16QAM, control of symbols along the circles does not cause any change in PAPR, but change of the radius ratio of the double circles effects PAPR. More specifically, when the radius ratio becomes smaller, PAPR also becomes smaller; when the radius ratio becomes larger, PAPR also becomes larger.

In this instance, the present invention should by no means be limited to the above-illustrated embodiment, and various changes or modifications may be suggested without departing from the gist of the invention.

INDUSTRIAL APPLICABILITY

As detailed above, according to the present invention, control is performed in such a manner that symbol arrangement with the multi-level modulation scheme is changed from an symbol arrangement at equal intervals thereof to other arrangements in accordance with a ratio of codes of different significance in bit correction, so that the effect of bit correction can be exhibited at maximum, an error rate on the receiver end being thereby improved in comparison with the previous art. The invention thus is considered to be greatly useful in the field of the digital radio communications technology.

What is claimed is:

1. A digital radio communications method using a multi-level modulation scheme for use in a digital radio communications system including: a transmitter which transmits a signal modulated with the multi-level modulation scheme in which a single symbol is transmitted using a plurality of bits; and a receiver which demodulates the reception signal received from the transmitter by means of performing a symbol evaluation, said digital radio communications method comprising:

on the transmitter,
performing a coding process of coding an information series to be transmitted, to generate multiple codes which are different in significance;
performing a bit correction process of controlling bit arrangement such that a code having high significance, out of said multiple codes obtained by said coding process, is allocated with high priority to a bit having a tendency such that the likelihood of the bit at the symbol evaluation performed on the receiver becomes large;
performing a multi-level modulation process of allocating the code to said plurality of bits in accordance with a bit arrangement obtained in said bit correction process to perform the multi-level modulation of the information series at a predetermined symbol arrangement on a complex plane; and
performing a symbol arrangement control process of controlling the symbol arrangement so as to change the positions of symbols on the complex plane arranged regularly such that at least a part of the symbols are arranged irregularly in accordance with a ratio of the codes different in significance in said bit correction process, while maintaining a transmission power before and after the control of the symbol arrangement, on the receiver,
demodulating a signal received from the transmitter based on information relating to the controlled symbol arrangement; and
performing decoding the demodulated signal to obtain the information series.

2. The method of claim 1, comprising:
in said symbol arrangement control process performed by the transmitter,
controlling the symbol arrangement such that the likelihood of a bit to which a code high in significance is allocated, out of said plurality of bits, becomes large.

3. The method of claim 1, comprising:
in said symbol arrangement control process performed by the transmitter,
controlling the symbol arrangement such that the likelihood of a bit to which a code low in significance is allocated, out of said plurality of bits, becomes large.

4. The method of claim 1, comprising:
in said bit correction process, controlling the bit arrangement such that a ratio of a plurality of types of codes low in significance, out of said multiple codes, is equal for every one of said plurality of bits.

5. The method of claim 1, wherein the transmitter further comprises a process of notifying the receiver beforehand of information relating to a symbol arrangement controlled in said symbol arrangement control process.

6. The method of claim 1, wherein the receiver holds information beforehand relating to the symbol arrangement with respect to a ratio of codes different in significance in a memory,
wherein the transmitter is operable to perform the process of notifying the receiver of information relating to the ratio, and
wherein the receiver is operable to perform the process of reading the information relating to the symbol arrangement based on information relating to the ratio notified from the transmitter, and the process of executing the demodulation based on the read out information.

7. The method of claim 3, wherein the code high in significance is a systematic code in a turbo code, and
wherein the code low in significance is a parity code in the turbo code.

8. An apparatus for use in a digital radio communications system including: a transmitter which transmits a signal modulated with a multi-level modulation scheme in which a single symbol is transmitted using a plurality of bits; and a receiver which performs a symbol evaluation of a reception signal from said transmitter and demodulates the reception signal received from the transmitter, said apparatus comprising:

a coder which codes an information series to be transmitted, to generate multiple codes different in significance;
a bit corrector which controls bit arrangement such that a code having high significance, out of said multiple codes, is allocated with high priority to a bit having a tendency such that the likelihood of the bit at the symbol evaluation performed on the receiver becomes large;
a modulator which allocates the code to said plurality of bits in accordance with a bit arrangement obtained by said bit corrector to perform the multi-level modulation of the information series with a predetermined symbol arrangement on a complex plane; and
a controller which controls the symbol arrangement so as to change the positions of symbols on the complex plane arranged regularly such that at least a part of the symbols are arranged irregularly in accordance with a ratio of the codes different in significance in said bit corrector, while maintaining a transmission power before and after the control of the symbol arrangement.

9. The apparatus of claim 8, wherein said controller controls the symbol arrangement such that the likelihood of a bit to which a code high in significance is allocated, out of said plurality of bits, becomes large.

10. The apparatus of claim 8, wherein said controller controls the symbol arrangement such that the likelihood of a bit, out of said plurality of bits, to be allocated with low priority becomes large.

11. The apparatus of claim 8, wherein said bit corrector controls the bit arrangement such that a ratio of a plurality of types of codes low in significance, out of said multiple codes, is equal for every one of said plurality of bits.

12. The apparatus of claim 8, wherein the transmitter transmits information relating to a symbol arrangement controlled by said controller to the receiver beforehand.

13. The apparatus of claim 8, wherein the code high in significance is a systematic code in a turbo code, and wherein the code low in significance is a parity code in the turbo code.

* * * * *